(12) United States Patent
Kashio et al.

(10) Patent No.: US 10,308,850 B2
(45) Date of Patent: Jun. 4, 2019

(54) CURABLE COMPOSITION, METHOD FOR MANUFACTURING CURABLE COMPOSITION, CURED PRODUCT, METHOD FOR USING CURABLE COMPOSITION, AND OPTICAL DEVICE

(71) Applicant: LINTEC CORPORATION, Tokyo (JP)

(72) Inventors: Mikihiro Kashio, Tokyo (JP); Masami Matsui, Tokyo (JP); Yae Ishikawa, Tokyo (JP); Hidekazu Nakayama, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 43 days.

(21) Appl. No.: 15/328,239

(22) PCT Filed: Jul. 23, 2015

(86) PCT No.: PCT/JP2015/070999
§ 371 (c)(1),
(2) Date: Jan. 23, 2017

(87) PCT Pub. No.: WO2016/013625
PCT Pub. Date: Jan. 28, 2016

(65) Prior Publication Data
US 2017/0210956 A1 Jul. 27, 2017

(30) Foreign Application Priority Data
Jul. 23, 2014 (JP) .................................. 2014-149756

(51) Int. Cl.
*C09J 183/04* (2006.01)
*C09J 11/06* (2006.01)
(Continued)

(52) U.S. Cl.
CPC ............ *C09J 183/04* (2013.01); *C08K 5/544* (2013.01); *C08K 5/548* (2013.01); *C08K 5/5435* (2013.01);
(Continued)

(58) Field of Classification Search
None
See application file for complete search history.

(56) References Cited

U.S. PATENT DOCUMENTS 9,670,326 B2 * 6/2017 Matsui ................ C08G 77/392
2009/0008673 A1 1/2009 Kato et al.
(Continued)

FOREIGN PATENT DOCUMENTS

EP 2915834 A1 9/2015
JP 2004-359933 A 12/2004
(Continued)

OTHER PUBLICATIONS

Extended European Search Report for counterpart European Application No. 15825257.7, dated Feb. 9, 2018.
(Continued)

*Primary Examiner* — Robert S Loewe
(74) *Attorney, Agent, or Firm* — Birch, Stewart, Kolasch & Birch, LLP

(57) ABSTRACT

The present invention is a curable composition comprising a component (A) and a component (B),
the curable composition producing a cured product that has a solid-state Si nuclear magnetic resonance spectrum in which a peak is observed within a range from −80 ppm or more to less than −40 ppm, and a half-width of the peak is 500 to 900 Hz,
the component (A) being a curable polysilsesquioxane compound that comprises a repeating unit represented by a formula (a-1), $$R^1SiO_{3/2} \qquad (a\text{-}1)$$

the component (B) being at least one silane coupling agent selected from a group consisting of a silane coupling agent that comprises a nitrogen atom in its
(Continued)

molecule, and a silane coupling agent that comprises an acid anhydride structure in its molecule, and
a method for producing the curable composition, and
a cured product, and
a method for using the curable composition, and
an optical device.

14 Claims, 9 Drawing Sheets

(51) Int. Cl.
    *C08K 5/5435*     (2006.01)
    *C08K 5/544*     (2006.01)
    *C09J 183/00*     (2006.01)
    *C09K 3/10*     (2006.01)
    *C08L 83/06*     (2006.01)
    *H01L 33/56*     (2010.01)
    *C08K 5/548*     (2006.01)
    *H01L 31/0203*     (2014.01)

(52) U.S. Cl.
    CPC ............ *C08K 5/5442* (2013.01); *C08L 83/06* (2013.01); *C09J 11/06* (2013.01); *C09J 183/00* (2013.01); *C09K 3/10* (2013.01); *H01L 31/0203* (2013.01); *H01L 33/56* (2013.01)

(56) References Cited

U.S. PATENT DOCUMENTS

| | | |
|---|---|---|
| 2013/0035455 A1 | 2/2013 | Kashio |
| 2015/0065663 A1* | 3/2015 | Matsui .................. C08K 5/544 525/477 |
| 2016/0009970 A1 | 1/2016 | Matsui et al. |
| 2017/0073474 A1 | 3/2017 | Matsui et al. |
| 2017/0253781 A1 | 9/2017 | Kashio et al. |

FOREIGN PATENT DOCUMENTS

| | | |
|---|---|---|
| JP | 2005-263869 A | 9/2005 |
| JP | 2006-328231 A | 12/2006 |
| JP | 2007-112975 A | 5/2007 |
| JP | 2012-197425 A | 10/2012 |
| JP | 5725479 B2 | 5/2015 |
| WO | WO 2011/11167 A1 | 9/2011 |
| WO | WO 2011/111673 A1 | 9/2011 |
| WO | WO 2012/073988 A1 | 6/2012 |
| WO | WO 2013/141360 A1 | 9/2013 |
| WO | WO 2014/069508 A1 | 5/2014 |
| WO | WO 2014/133103 A1 | 9/2014 |
| WO | WO 2015/170709 A1 | 11/2015 |
| WO | WO 2016/031728 A1 | 3/2016 |

OTHER PUBLICATIONS

International Preliminary Report on Patentability and Written Opinion of the International Searching Authority (Forms PCT/IB/373 and PCT/ISA/237) for International Application No. PCT/JP2015/070999, dated Jan. 24, 2017, with an English translation thereof.

* cited by examiner

CURABLE COMPOSITION, METHOD FOR MANUFACTURING CURABLE COMPOSITION, CURED PRODUCT, METHOD FOR USING CURABLE COMPOSITION, AND OPTICAL DEVICE

TECHNICAL FIELD

The present invention relates to a curable composition that produces a cured product that exhibits excellent heat resistance and high adhesion, a method for producing the same, a cured product obtained by curing the curable composition, a method for using the curable composition as an optical element-securing adhesive or an optical element sealing material, and an optical device.

BACKGROUND ART

A curable composition has been improved in various ways taking account of the application, and widely used as a raw material for producing optical parts and formed articles, an adhesive, a coating material, and the like.

A curable composition has attracted attention as an optical element-securing composition (e.g., optical element adhesive and optical element sealing material) that is used when producing a sealed optical element.

Examples of the optical element include a light-emitting element (e.g., laser (e.g., semiconductor laser diode (LD)) and light-emitting diode (LED)), a light-receiving element, a hybrid optical element, an optical integrated circuit, and the like.

In recent years, an optical element that emits blue light or white light (i.e., an optical element that has a shorter emission peak wavelength) has been developed, and widely used. There is a tendency that a light-emitting element having a short emission peak wavelength is significantly increased in brightness, and the amount of heat generated by such an optical element further increases.

Along with a recent increase in brightness of an optical element, a cured product of an optical element-securing composition may deteriorate due to long-term exposure to high-energy light or high-temperature heat generated by such an optical element, whereby delamination or a decrease in adhesion may occur.

In order to solve the above problem, Patent Literature 1 to 3 propose an optical element-securing composition that includes a polysilsesquioxane compound as the main component.

However, the compositions and the cured products (e.g., members) disclosed in Patent Literature 1 to 3 may not exhibit sufficient heat resistance while maintaining sufficient adhesion.

Therefore, development of a curable composition that produces a cured product that exhibits excellent heat resistance and high adhesion has been desired.

Patent Literature 4 discloses a semiconductor light-emitting device member that is specified by (i) the chemical shift and the half-width of the peak observed in the solid-state Si nuclear magnetic resonance spectrum, (ii) the silicon content, and (iii) the silanol content.

CITATION LIST

Patent Literature

Patent Literature 1: JP-A-2004-359933
Patent Literature 2: JP-A-2005-263869
Patent Literature 3: JP-A-2006-328231
Patent Literature 4: JP-A-2007-112975 (US2009008673A1)

SUMMARY OF INVENTION

Technical Problem

The invention was conceived in view of the above situation. An object of the invention is to provide a curable composition that produces a cured product that exhibits excellent heat resistance and high adhesion, a method for producing the same, a cured product obtained by curing the curable composition, a method for using the curable composition as an optical element-securing adhesive or an optical element sealing material, and an optical device.

Solution to Problem

The inventors conducted extensive studies in order to solve the above problem. As a result, the inventors found that a curable composition that includes a specific polysilsesquioxane compound and a specific silane coupling agent, and produces a cured product that has a solid-state Si nuclear magnetic resonance spectrum in which a peak is observed within a specific range, and the half-width of the peak falls within a specific range, can produce a cured product that exhibits excellent heat resistance and high adhesion. This finding has led to the completion of the invention.

Several aspects of the invention provide the following curable composition (see (1) to (6)), method for producing a curable composition (see (7) to (9)), cured product (see (10) and (11)), method for using a curable composition (see (12) and (13)), and optical device (see (14)).

(1) A curable composition including a component (A) and a component (B), the curable composition producing a cured product that has a solid-state Si nuclear magnetic resonance spectrum in which a peak is observed within a range from −80 ppm or more to less than −40 ppm, and the half-width of the peak is 500 to 900 Hz, the component (A) being a curable polysilsesquioxane compound that includes a repeating unit represented by a formula (a-1), $$R^1SiO_{3/2} \qquad \text{(a-1)}$$

wherein $R^1$ is a substituted or unsubstituted alkyl group having 1 to 10 carbon atoms, or a substituted or unsubstituted aryl group, and the component (B) being at least one silane coupling agent selected from the group consisting of a silane coupling agent that includes a nitrogen atom in its molecule, and a silane coupling agent that includes an acid anhydride structure in its molecule.

(2) The curable composition according to (1), wherein $R^1$ is a substituted or unsubstituted alkyl group having 1 to 10 carbon atoms.

(3) The curable composition according to (1) or (2), wherein the curable polysilsesquioxane compound that is used as the component (A) has a mass average molecular weight (Mw) of 1,000 to 30,000.

(4) The curable composition according to any one of (1) to (3), wherein the curable polysilsesquioxane compound that is used as the component (A) is a curable polysilsesquioxane compound obtained by subjecting at least one compound represented by a formula (a-2) to polycondensation in the presence of a polycondensation catalyst, $$R^1Si(OR^2)_x(X^1)_{3-x} \qquad \text{(a-2)}$$

wherein R¹ is the same as defined above, R² is an alkyl group having 1 to 10 carbon atoms, X¹ is a halogen atom, and x is an integer from 0 to 3, provided that a plurality of R² are either identical to or different from each other when a plurality of R² are present, and a plurality of X¹ are either identical to or different from each other when a plurality of X¹ are present.

(5) The curable composition according to any one of (1) to (4), wherein the component (B) includes both the silane coupling agent that includes a nitrogen atom in its molecule, and the silane coupling agent that includes an acid anhydride structure in its molecule.

(6) The curable composition according to any one of (1) to (5), the curable composition including the component (A) and the component (B) in a mass ratio (component (A): component (B)) of 100:0.01 to 100:50.

(7) A method for producing the curable composition according to (1), including:

a step (I) that subjects at least one compound represented by a formula (a-2) to polycondensation in the presence of a polycondensation catalyst to obtain the curable polysilsesquioxane compound,

(a-2)

wherein R¹ is the same as defined above, R² is an alkyl group having 1 to 10 carbon atoms, X¹ is a halogen atom, and x is an integer from 0 to 3, provided that a plurality of R² are either identical to or different from each other when a plurality of R² are present, and a plurality of X¹ are either identical to or different from each other when a plurality of X¹ are present; and a step (II) that mixes the curable polysilsesquioxane compound obtained by the step (I) with at least one silane coupling agent selected from the group consisting of the silane coupling agent that includes a nitrogen atom in its molecule, and the silane coupling agent that includes an acid anhydride structure in its molecule.

(8) The method according to (7), wherein at least an acid catalyst is used as the polycondensation catalyst.

(9) The method according to (8), wherein the acid catalyst is at least one compound selected from phosphoric acid, hydrochloric acid, boric acid, citric acid, acetic acid, sulfuric acid, and methanesulfonic acid.

(10) A cured product obtained by curing the curable composition according to any one of (1) to (6).

(11) The cured product according to (10), the cured product being an optical element-securing material.

(12) A method for using the curable composition according to any one of (1) to (6) as an optical element-securing adhesive.

(13) A method for using the curable composition according to any one of (1) to (6) as an optical element sealing material.

(14) An optical device produced using the curable composition according to any one of (1) to (6) as an optical element-securing adhesive or an optical element sealing material.

Advantageous Effects of Invention

The curable composition according to one aspect of the invention can produce a cured product that exhibits excellent heat resistance and high adhesion.

The curable composition according to one aspect of the invention can suitably be used as an optical element-securing adhesive and an optical element sealing material.

The cured product according to one aspect of the invention exhibits excellent heat resistance and high adhesion.

DESCRIPTION OF EMBODIMENTS

Figure 1:
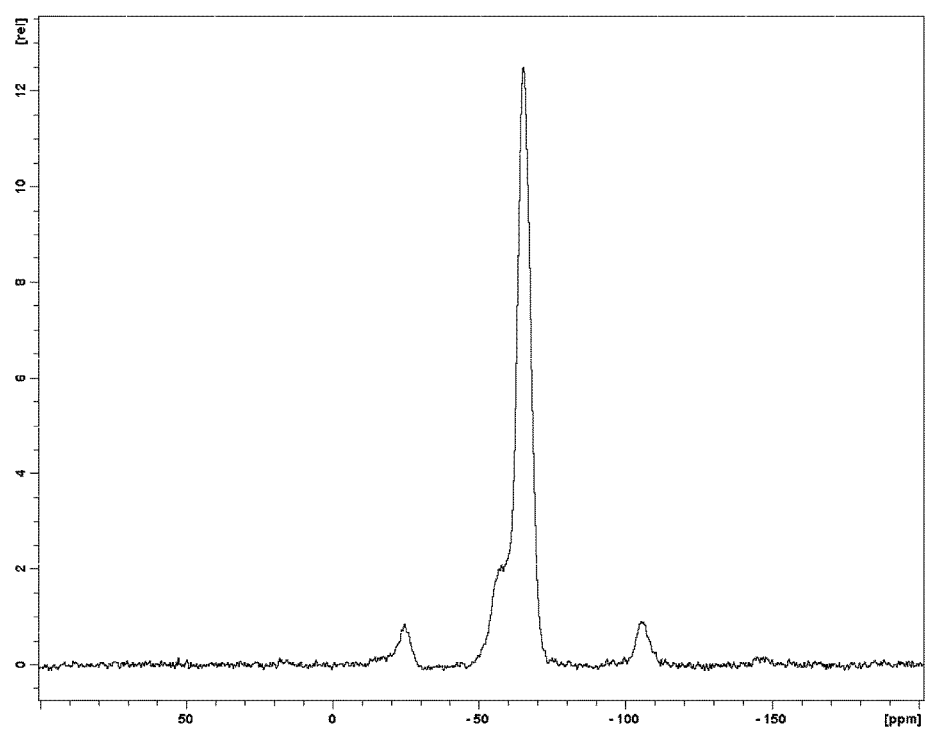
FIG. 1 illustrates the solid-state Si-NMR spectrum of the cured product obtained in Example 1.

A curable composition, a method for producing the same, a cured product, a method for using a curable composition, and an optical device according to the exemplary embodiments of the invention are described in detail below.

1) Curable Composition

A curable composition according to one embodiment of the invention includes the component (A) and the component (B), the curable composition producing a cured product that has a solid-state Si nuclear magnetic resonance spectrum in which a peak is observed within a range from −80 ppm or more to less than −40 ppm, and the half-width of the peak is 500 to 900 Hz.

Component (A)

The component (A) included in the curable composition according to one embodiment of the invention is a curable polysilsesquioxane compound that includes a repeating unit represented by the formula (a-1) (hereinafter may be referred to as "silane compound polymer (A)").

R¹ in the formula (a-1) is a substituted or unsubstituted alkyl group having 1 to carbon atoms, or a substituted or unsubstituted aryl group.

Examples of the alkyl group having 1 to 10 carbon atoms that may be represented by R¹ include a methyl group, an ethyl group, an n-propyl group, an isopropyl group, an n-butyl group, an isobutyl group, an s-butyl group, a t-butyl group, an n-pentyl group, an n-hexyl group, an n-octyl group, an n-nonyl group, and the like. Among these, an alkyl group having 1 to 6 carbon atoms is preferable, and an alkyl group having 1 to 3 carbon atoms is more preferable.

Examples of the substituent when R¹ is a substituted alkyl group having 1 to 10 carbon atoms include a halogen atom (e.g., fluorine atom, chlorine atom, bromine atom, and iodine atom); a cyano group; and a group represented by OG.

G is a protecting group for a hydroxyl group. The protecting group for a hydroxyl group is not particularly limited. The protecting group for a hydroxyl group may be an arbitrary protecting group that is known as a protecting group for a hydroxyl group. Examples of the protecting group for a hydroxyl group include an acyl-based protecting group; a silyl-based protecting group such as a trimethylsilyl group, a triethylsilyl group, a t-butyldimethylsilyl group, and a t-butyldiphenylsilyl group; an acetal-based protecting group such as a methoxymethyl group, a methoxyethoxymethyl group, a 1-ethoxyethyl group, a tetrahydropyran-2-yl group, and a tetrahydrofuran-2-yl group; an alkoxycarbonyl-based protecting group such as a t-butoxycarbonyl group; an ether-based protecting group such as a methyl group, an ethyl group, a t-butyl group, an octyl group, an allyl group, a triphenylmethyl group, a benzyl group, a p-methoxybenzyl group, a fluorenyl group, a trityl group, and a benzhydryl group; and the like. It is preferable that G be an acyl-based protecting group.

The acyl-based protecting group is a group represented by —C(=O)R (wherein R is an alkyl group having 1 to 6 carbon atoms (e.g., methyl group, ethyl group, n-propyl group, isopropyl group, n-butyl group, isobutyl group, s-butyl group, t-butyl group, or n-pentyl group), or a substituted or unsubstituted phenyl group).

Examples of the substituent when R is a substituted phenyl group include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; a halogen atom such as a fluorine atom, a chlorine atom, and a bromine atom; an alkoxy group such as a methoxy group and an ethoxy group; and the like.

Examples of the aryl group that may be represented by $R^1$ include a phenyl group, a 1-naphthyl group, a 2-naphthyl group, and the like.

Examples of the substituent when $R^1$ is a substituted aryl group include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; a halogen atom such as a fluorine atom, a chlorine atom, and a bromine atom; an alkoxy group such as a methoxy group and an ethoxy group; and the like.

It is preferable that $R^1$ be a substituted or unsubstituted alkyl group having 1 to carbon atoms, more preferably a substituted or unsubstituted alkyl group having 1 to 6 carbon atoms, and still more preferably a substituted or unsubstituted alkyl group having 1 to 3 carbon atoms, since a curable composition that produces a cured product that exhibits better heat resistance and adhesion is easily obtained.

The silane compound polymer (A) may include a repeating unit other than the repeating unit represented by the formula (a-1). Examples of the repeating unit other than the repeating unit represented by the formula (a-1) include a repeating unit represented by the following formula (a-3), and a repeating unit represented by the following formula (a-4).

$$R^1SiZO_{2/2} \qquad (a-3)$$

$$R^1SiZ_2O_{1/2} \qquad (a-4)$$

$R^1$ in the formulas (a-3) and (a-4) is the same as defined above. Z is a hydroxy group, an alkoxy group having 1 to 10 carbon atoms, or a halogen atom. Examples of the alkoxy group having 1 to 10 carbon atoms include a methoxy group, an ethoxy group, a propoxy group, an isopropoxy group, a butoxy group, a t-butoxy group, a pentyloxy group, a hexyloxy group, an octyloxy group, and the like. Examples of the halogen atom include a fluorine atom, a chlorine atom, a bromine atom, and the like.

It is preferable that Z be a hydroxy group or an alkoxy group having 1 to 6 carbon atoms.

The content of the repeating unit represented by the formula (a-1) in the silane compound polymer (A) is preferably 40 mass % or more, more preferably 50 to 95 mass %, and still more preferably 60 to 90 mass %, based on the total amount of repeating units.

The content of the repeating unit represented by the formula (a-1) in the silane compound polymer (A) can be determined by measuring the Si nuclear magnetic resonance spectrum of the silane compound polymer (A), for example.

The silane compound polymer (A) may be a homopolymer that includes only one type of $R^1$, or may be a copolymer that includes two or more types of $R^1$. When the silane compound polymer (A) includes the repeating unit represented by the formula (a-3) and the repeating unit represented by the formula (a-4), the silane compound polymer (A) may include only one type of Z, or may include two or more types of Z.

When the silane compound polymer (A) is a copolymer, the silane compound polymer (A) may be a random copolymer, a block copolymer, a graft copolymer, an alternating copolymer, or the like. In this case, it is preferable that the silane compound polymer (A) be a random copolymer from the viewpoint of ease of production and the like.

The silane compound polymer (A) may have a ladder-like structure, a double decker-like structure, a basket-like structure, a partially cleaved basket-like structure, a cyclic structure, or a random structure.

The mass average molecular weight (Mw) of the silane compound polymer (A) is normally 1,000 to 30,000, preferably 3,000 to 20,000, and more preferably 5,000 to 15,000. When the mass average molecular weight (Mw) of the silane compound polymer (A) is within the above range, the resulting composition exhibits an excellent handling capability, and a cured product that exhibits excellent adhesion and excellent heat resistance is easily obtained.

The molecular weight distribution (Mw/Mn) of the silane compound polymer (A) is not particularly limited, but is normally 1.0 to 10.0, and preferably 1.1 to 6.0. When the molecular weight distribution (Mw/Mn) of the silane compound polymer (A) is within the above range, a cured product that exhibits better adhesion and heat resistance is easily obtained.

The mass average molecular weight (Mw) and the number average molecular weight (Mn) may be determined as standard polystyrene-equivalent values by gel permeation chromatography (GPC) (eluent: tetrahydrofuran (THF)), for example.

These silane compound polymers (A) may be used either alone or in combination.

The silane compound polymer (A) may be produced using an arbitrary method. For example, the silane compound polymer (A) can be produced by subjecting at least one silane compound (1) represented by the following formula (a-2) to polycondensation.

$$R^1Si(OR^2)_x(X^1)_{3-x} \qquad (a-2)$$

wherein $R^1$ is the same as defined above, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present.

Examples of the alkyl group having 1 to 10 carbon atoms that is represented by $R^2$ include a methyl group, an ethyl group, an n-propyl group, an isopropyl group, an n-butyl group, an s-butyl group, an isobutyl group, a t-butyl group, and the like.

Examples of the halogen atom that is represented by $X^1$ include a chlorine atom, a bromine atom, and the like.

Specific examples of the silane compound (1) include alkyltrialkoxysilane compounds such as methyltrimethoxysilane, methyltriethoxysilane, ethyltrimethoxysilane, ethyltriethoxysilane, ethyltripropoxysilane, n-propyltrimethoxysilane, n-propyltriethoxysilane, n-propyltripropoxysilane, n-propyltributoxysilane, n-butyltrimethoxysilane, isobutyltrimethoxysilane, n-pentyltrimethoxysilane, n-hexyltrimethoxysilane, and isooctyltriethoxysilane;

alkylhalogenoalkoxysilane compounds such as methylchlorodimethoxysilane, methylchlorodiethoxysilane, methyldichloromethoxysilane, methylbromodimethoxysilane, ethylchlorodimethoxysilane, ethylchlorodiethoxysilane, ethyldichloromethoxysilane, ethylbromodimethoxysilane, n-propylchlorodimethoxysilane, n-propyldichloromethoxysilane, n-butylchlorodimethoxysilane, and n-butyldichloromethoxysilane;

alkyltrihalogenosilane compounds such as methyltrichlorosilane, methyltribromosilane, ethyltrichlorosilane, ethyltribromosilane, n-propyltrichlorosilane, n-propyltribromosilane, n-butyltrichlorosilane, isobutyltrichlorosilane, n-pentyltrichlorosilane, n-hexyltrichlorosilane, and isooctyltrichlorosilane; and the like.

Alkyltrialkoxysilane compounds is preferable as the silane compound (1) since a curable composition that produces a cured product that exhibits better adhesion can be obtained.

These silane compounds (1) may be used either alone or in combination.

The silane compound (1) may be subjected to polycondensation using an arbitrary method. For example, the silane compound (1) may be subjected to polycondensation by adding a specific amount of polycondensation catalyst to the silane compound (1) in the presence or absence of a solvent, and stirring the mixture at a specific temperature. More specifically, the silane compound (1) may be subjected to polycondensation using a method (a) that adds a specific amount of an acid catalyst to the silane compound (1), and stirs the mixture at a specific temperature, a method (b) that adds a specific amount of a base catalyst to the silane compound (1), and stirs the mixture at a specific temperature, a method (c) that adds a specific amount of an acid catalyst to the silane compound (1), stirs the mixture at a specific temperature, adds an excess amount of a base catalyst to the mixture so that the reaction system becomes basic, and stirs the mixture at a specific temperature, or the like. It is preferable to use the method (a) or (c) since the desired silane compound polymer (A) can be efficiently obtained.

An acid catalyst or a base catalyst may be used as the catalyst. Two or more catalysts may be used in combination. Note that it is preferable to use at least an acid catalyst.

Examples of the acid catalyst include an inorganic acid such as phosphoric acid, hydrochloric acid, boric acid, sulfuric acid, and nitric acid; an organic acid such as citric acid, acetic acid, methanesulfonic acid, trifluoromethanesulfonic acid, benzenesulfonic acid, and p-toluenesulfonic acid; and the like. It is preferable to use at least one compound selected from phosphoric acid, hydrochloric acid, boric acid, sulfuric acid, citric acid, acetic acid, and methanesulfonic acid.

Examples of the base catalyst include aqueous ammonia; an organic base such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; an organic base hydroxide such as tetramethylammonium hydroxide and tetraethylammonium hydroxide; a metal alkoxide such as sodium methoxide, sodium ethoxide, sodium t-butoxide, and potassium t-butoxide; a metal hydride such as sodium hydride and calcium hydride; a metal hydroxide such as sodium hydroxide, potassium hydroxide, and calcium hydroxide; a metal carbonate such as sodium carbonate, potassium carbonate, and magnesium carbonate; a metal hydrogen carbonate such as sodium hydrogen carbonate and potassium hydrogen carbonate; and the like.

The catalyst is normally used in a ratio of 0.1 to 10 mol %, and preferably 1 to 5 mol %, based on the total number of moles of the silane compound (1).

When a solvent is used, the solvent may be appropriately selected taking account of the type of silane compound (1) and the like. Examples of the solvent include water; aromatic hydrocarbons such as benzene, toluene, and xylene; esters such as methyl acetate, ethyl acetate, propyl acetate, butyl acetate, and methyl propionate; ketones such as acetone, methyl ethyl ketone, methyl isobutyl ketone, and cyclohexanone; alcohols such as methyl alcohol, ethyl alcohol, n-propyl alcohol, isopropyl alcohol, n-butyl alcohol, isobutyl alcohol, s-butyl alcohol, and t-butyl alcohol; and the like. These solvents may be used either alone or in combination. When the method (c) is used, a polycondensation reaction may be effected in an aqueous system in the presence of the acid catalyst, an organic solvent and an excess amount of the base catalyst (e.g., aqueous ammonia) may be added to the reaction mixture, and a polycondensation reaction may be effected under basic conditions.

The solvent is used in an amount of 0.1 to 10 l, and preferably 0.1 to 2 l, per mol of the silane compound (1).

The silane compound (1) is normally subjected to polycondensation at a temperature of 0° C. to the boiling point of the solvent, and preferably 20 to 100° C. If the reaction temperature is too low, the polycondensation reaction may not sufficiently proceed. If the reaction temperature is too high, it may be difficult to suppress gelation. The reaction is normally completed within 30 minutes to 20 hours.

After completion of the reaction, the reaction solution is neutralized by adding an aqueous solution including an alkali (e.g., sodium hydrogen carbonate) to the reaction solution when the acid catalyst is used, or neutralized by adding an acid (e.g., hydrochloric acid) to the reaction solution when the base catalyst is used. Salts produced during neutralization are removed by filtration, washing with water, or the like to obtain the desired silane compound polymer (A).

When the silane compound polymer (A) is produced using the above method, $OR^2$ or $X^1$ included in the silane compound (1) remains in the silane compound polymer (A) when $OR^2$ or $X^1$ has not been subjected to dealcoholization or the like. Therefore, the silane compound polymer (A) may include the repeating unit represented by the formula (a-3) and the repeating unit represented by the formula (a-4).

Component (B)

The curable composition according to one embodiment of the invention includes at least one silane coupling agent selected from the group consisting of a silane coupling agent that includes a nitrogen atom in its molecule (hereinafter may be referred to as "silane coupling agent (B1)"), and a silane coupling agent that includes an acid anhydride structure in its molecule (hereinafter may be referred to as "silane coupling agent (B2)"), as the component (B).

The silane coupling agent (B1) is not particularly limited as long as the silane coupling agent (B1) includes a nitrogen atom in its molecule. Examples of the silane coupling agent (B1) include a trialkoxysilane compound represented by the following formula (b-1), a dialkoxyalkylsilane compound or a dialkoxyarylsilane compound represented by the following formula (b-2), and the like.

$(R^a)_3SiR^c$       (b-1)

$(R^a)_2(R^b)SiR^c$       (b-2)

$R^a$ in the formulas (b-1) and (b-2) is an alkoxy group having 1 to 6 carbon atoms, such as a methoxy group, an ethoxy group, an n-propoxy group, an isopropoxy group, an n-butoxy group, or a t-butoxy group. A plurality of $R^a$ may be either identical to or different from each other.

$R^b$ is an alkyl group having 1 to 6 carbon atoms, such as a methyl group, an ethyl group, an n-propyl group, an isopropyl group, an n-butyl group, or a t-butyl group, or a substituted or unsubstituted aryl group such as a phenyl group, a 4-chlorophenyl group, or a 4-methylphenyl group.

$R^c$ is an organic group having 1 to 10 carbon atoms that includes a nitrogen atom. $R^c$ may be bonded to a group that includes a silicon atom.

Specific examples of the organic group having 1 to 10 carbon atoms represented by $R^c$ include an N-2-(aminoethyl)-3-aminopropyl group, a 3-aminopropyl group, an N-(1,3-dimethylbutylidene)aminopropyl group, a 3-ureidopropyltriethoxysilane group, an N-phenylaminopropyl group, and the like.

Examples of the compound represented by the formula (b-1) or (b-2) in which $R^e$ is an organic group that is bonded to a group that includes a silicon atom, include a compound in which $R^e$ is bonded to the silicon atom through an isocyanurate skeleton to form an isocyanurate-based silane coupling agent, and a compound in which $R^c$ is bonded to the silicon atom through a urea skeleton to form a urea-based silane coupling agent.

The silane coupling agent (B1) is preferably an isocyanurate-based silane coupling agent or a urea-based silane coupling agent, and more preferably an isocyanurate-based silane coupling agent or a urea-based silane coupling agent that includes four or more alkoxy groups bonded to a silicon atom in the molecule, since a cured product that exhibits higher adhesion is easily obtained.

Note that the expression "includes four or more alkoxy groups bonded to a silicon atom" used herein means that the total number of alkoxy groups bonded to an identical silicon atom and alkoxy groups bonded to different silicon atoms is equal to or larger than 4.

Examples of the isocyanurate-based silane coupling agent that includes four or more alkoxy groups bonded to a silicon atom include a compound represented by the following formula (b-3). Examples of the urea-based silane coupling agent that includes four or more alkoxy groups bonded to a silicon atom include a compound represented by the following formula (b-4).

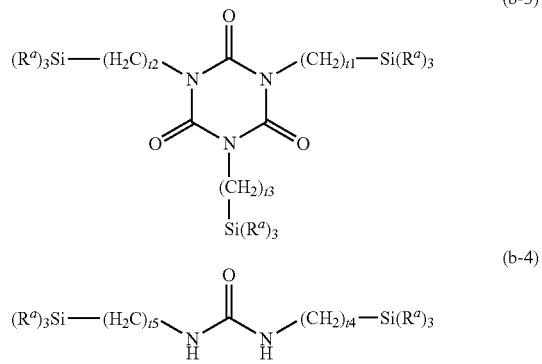

$R^a$ in the formulas (b-3) and (b-4) is the same as defined above.

t1 to t5 are independently an integer from 1 to 10, preferably an integer from 1 to 6, and particularly preferably 3.

Specific examples of the compound represented by the formula (b-3) include a 1,3,5-N-tris[(tri($C_{1-6}$)alkoxy)silyl ($C_{1-10}$)alkyl] isocyanurate such as 1,3,5-N-tris(3-trimethoxysilylpropyl) isocyanurate, 1,3,5-N-tris(3-triethoxysilylpropyl) isocyanurate, 1,3,5-N-tris(3-tri-i-propoxysilylpropyl) isocyanurate, and 1,3,5-N-tris(3-tributoxysilylpropyl) isocyanurate; a 1,3,5-N-tris[(di($C_{1-6}$)alkoxy)silyl($C_{1-10}$)alkyl] isocyanurate such as 1,3,5-N-tris(3-dimethoxymethylsilylpropyl) isocyanurate, 1,3,5-N-tris(3-dimethoxyethylsilylpropyl) isocyanurate, 1,3,5-N-tris(3-dimethoxy-i-propylsilylpropyl) isocyanurate, 1,3,5-N-tris(3-dimethoxy-n-propylsilylpropyl) isocyanurate, 1,3,5-N-tris(3-dimethoxyphenylsilylpropyl) isocyanurate, 1,3,5-N-tris(3-diethoxymethylsilylpropyl) isocyanurate, 1,3,5-N-tris(3-diethoxyethylsilylpropyl) isocyanurate, 1,3,5-N-tris(3-diethoxy-i-propylsilylpropyl) isocyanurate, 1,3,5-N-tris(3-diethoxy-n-propylsilylpropyl) isocyanurate, 1,3,5-N-tris(3-diethoxyphenylsilylpropyl) isocyanurate, 1,3,5-N-tris(3-di-i-propoxymethylsilylpropyl) isocyanurate, 1,3,5-N-tris(3-di-i-propoxyethylsilylpropyl) isocyanurate, 1,3,5-N-tris(3-di-i-propoxy-i-propylsilylpropyl) isocyanurate, 1,3,5-N-tris(3-di-i-propoxy-n-propylsilylpropyl) isocyanurate, 1,3,5-N-tris(3-di-i-propoxyphenylsilylpropyl) isocyanurate, 1,3,5-N-tris(3-dibutoxymethylsilylpropyl) isocyanurate, 1,3,5-N-tris(3-dibutoxyethylsilylpropyl) isocyanurate, 1,3,5-N-tris(3-dibutoxy-i-propylsilylpropyl) isocyanurate, 1,3,5-N-tris(3-dibutoxy-n-propylsilylpropyl) isocyanurate, and 1,3,5-N-tris(3-dibutoxyphenylsilylpropyl) isocyanurate; and the like.

Specific examples of the compound represented by the formula (b-4) include an N,N'-bis(tri($C_{1-6}$)alkoxysilyl($C_{1-10}$)alkyl)urea such as N,N'-bis(3-trimethoxysilylpropyl)urea, N,N'-bis(3-triethoxysilylpropyl)urea, N,N'-bis(3-tripropoxysilylpropyl)urea, N,N'-bis(3-tributoxysilylpropyl)urea, and N,N'-bis(2-trimethoxysilylethyl)urea; an N,N'-bis(di($C_{1-6}$)alkoxy($C_{1-6}$)alkylsilyl($C_{1-10}$)alkyl)urea such as N,N'-bis(3-dimethoxymethylsilylpropyl)urea, N,N'-bis(3-dimethoxyethylsilylpropyl)urea, and N,N'-bis(3-diethoxymethylsilylpropyl)urea; an N,N'-bis(di($C_{1-6}$)alkoxy($C_{6-20}$)arylsilyl($C_{1-10}$)alkyl)urea such as N,N'-bis(3-dimethoxyphenylsilylpropyl)urea and N,N'-bis(3-diethoxyphenylsilylpropyl)urea; and the like.

It is preferable to use either or both of 1,3,5-N-tris(3-trimethoxysilylpropyl) isocyanurate and 1,3,5-N-tris(3-triethoxysilylpropyl) isocyanurate (hereinafter collectively referred to as "isocyanurate compound"), or either or both of N,N'-bis(3-trimethoxysilylpropyl)urea and N,N'-bis(3-triethoxysilylpropyl)urea (hereinafter collectively referred to as "urea compound"), or a combination of the isocyanurate compound and the urea compound, as the silane coupling agent (B 1).

When a combination of the isocyanurate compound and the urea compound is used as the silane coupling agent (B1), the isocyanurate compound and the urea compound are preferably used in a mass ratio (isocyanurate compound:urea compound) of 100:1 to 100:200, and more preferably 100:10 to 100:110. When the isocyanurate compound and the urea compound are used in a mass ratio within the above range, it is possible to obtain a curable composition that produces a cured product that exhibits better heat resistance and adhesion.

The silane coupling agent (B2) is an organosilicon compound that includes a group (Q) having an acid anhydride structure and a hydrolyzable group ($R^e$) in one molecule. More specifically, the silane coupling agent (B1) is a compound represented by the following formula (b-5).

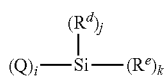

(b-5)

In the formula (b-5), Q is an acid anhydride structure, $R^d$ is an alkyl group having 1 to 6 carbon atoms, or a substituted or unsubstituted phenyl group, $R^e$ is an alkoxy group having 1 to 6 carbon atoms, or a halogen atom, i and k are an integer from 1 to 3, and j is an integer from 0 to 2, provided that i+j+k=4. A plurality of $R^d$ may be either identical to or different from each other when j is 2. A plurality of $R^e$ may be either identical to or different from each other when k is 2 or 3. A plurality of Q may be either identical to or different from each other when i is 2 or 3.

Examples of Q include the groups respectively represented by the following formulas (Q1) to (Q4), and the like. The group represented by the formula (Q1) is particularly preferable.

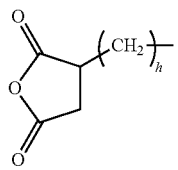

(Q1)

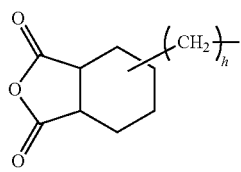

(Q2)

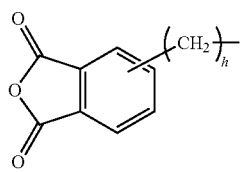

(Q3)

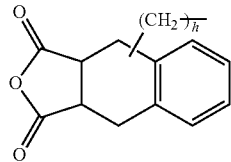

(Q4)

wherein h is an integer from 0 to 10.

Examples of the alkyl group having 1 to 6 carbon atoms that may be represented by $R^d$ in the formula (b-5) include those mentioned above in connection with the alkyl group having 1 to 6 carbon atoms that may be represented by $R^1$. Examples of the substituted or unsubstituted phenyl group that may be represented by $R^d$ in the formula (b-5) include those mentioned above in connection with the substituted or unsubstituted phenyl group that may be represented by R.

Examples of the alkoxy group having 1 to 6 carbon atoms that may be represented by $R^e$ include a methoxy group, an ethoxy group, a propoxy group, an isopropoxy group, a butoxy group, a t-butoxy group, and the like.

Examples of the halogen atom that may be represented by $R^e$ include a chlorine atom, a bromine atom, and the like.

A compound represented by the following formula (b-6) is preferable as the compound represented by the formula (b-5).

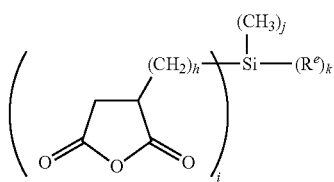

(b-6)

wherein $R^e$, h, i, j, and k are the same as defined above.

h in the formula (b-6) is preferably 2 to 8, more preferably 2 or 3, and particularly preferably 3.

Specific examples of the silane coupling agent represented by the formula (b-6) include a tri($C_{1-6}$)alkoxysilyl($C_{2-8}$)alkylsuccinic anhydride such as 2-(trimethoxysilyl)ethylsuccinic anhydride, 2-(triethoxysilyl)ethylsuccinic anhydride, 3-(trimethoxysilyl)propylsuccinic anhydride, and 3-(triethoxysilyl)propylsuccinic anhydride; a di($C_{1-6}$)alkoxymethylsilyl($C_{2-8}$)alkylsuccinic anhydride such as 2-(dimethoxymethylsilyl)ethylsuccinic anhydride; a ($C_{1-6}$)alkoxydimethylsilyl($C_{2-8}$)alkylsuccinic anhydride such as 2-(methoxydimethylsilyl)ethylsuccinic anhydride; a trihalogenosilyl($C_{2-8}$)alkylsuccinic anhydride such as 2-(trichlorosilyl)ethylsuccinic anhydride and 2-(tribromosilyl)ethylsuccinic anhydride; a dihalogenomethylsilyl($C_{2-8}$) alkylsuccinic anhydride such as 2-(dichloromethylsilyl)ethylsuccinic anhydride; a halogenodimethylsilyl($C_{2-8}$) alkylsuccinic anhydride such as 2-(chlorodimethylsilyl) ethylsuccinic anhydride; and the like.

Among these, a tri($C_{1-6}$)alkoxysilyl($C_{2-8}$)alkylsuccinic anhydride is preferable, and 3-(trimethoxysilyl)propylsuccinic anhydride and 3-(triethoxysilyl)propylsuccinic anhydride are particularly preferable.

These silane coupling agents may be used either alone or in combination as the component (B).

It is preferable that the component (B) include both the silane coupling agent (B1) and the silane coupling agent (B2).

When the component (B) includes both the silane coupling agent (B 1) and the silane coupling agent (B2), it is preferable that the component (B) include the silane coupling agent (B1) and the silane coupling agent (B2) in a mass ratio (silane coupling agent (B1):silane coupling agent (B2)) of 100:1 to 100:200, and more preferably 100:5 to 100:50.

It is preferable that the curable composition according to one embodiment of the invention include the component (A) and the component (B) in a mass ratio (component (A): component (B)) of 100:0.01 to 100:50, and more preferably 100:0.1 to 100:30.

When the component (A) and the component (B) are used in a ratio within the above range, the curable composition according to one embodiment of the invention produces a cured product that exhibits better heat resistance and adhesion.

Component (C)

The curable composition according to one embodiment of the invention may include a silane coupling agent that includes a sulfur atom-containing functional group in its molecule (hereinafter may be referred to as "silane coupling agent (C)") as a component (C).

Examples of the sulfur atom-containing functional group included in the silane coupling agent (C) include a thiol group (—SH); an acylthio group (—S—CO—R'); a sulfide group (—S—); a polysulfide group (—(S)$_n$—) such as a disulfide group (—S—S—) and a tetrasulfide group (—S—S—S—S—); and the like.

Examples of the silane coupling agent (C) include silane coupling agents respectively represented by the following formulas (c-1) to (c-4), other silane coupling agents that include a sulfur atom-containing functional group, oligomers thereof, and the like.

(c-1)

(c-2)

(c-3)

(c-4)

wherein $Y^1$ and $Y^2$ are independently an alkoxy group having 1 to 10 carbon atoms, $A^1$ and $A^2$ are independently a substituted or unsubstituted divalent hydrocarbon group having 1 to 20 carbon atoms, $R^1$ is a monovalent organic group having 1 to 20 carbon atoms, and v is an integer from 1 to 4, provided that a plurality of $Y^1$ are either identical to or different from each other, and a plurality of $Y^2$ are either identical to or different from each other.

Examples of the alkoxy group having 1 to 10 carbon atoms represented by $Y^1$ and $Y^2$ include a methoxy group, an ethoxy group, an n-propoxy group, an isopropoxy group, an n-butoxy group, an s-butoxy group, an isobutoxy group, a t-butoxy group, and the like.

$Y^1$ and $Y^2$ are preferably an alkoxy group having 1 to 6 carbon atoms.

Examples of the substituted or unsubstituted divalent hydrocarbon group having 1 to 20 carbon atoms represented by $A^1$ and $A^2$ include an alkylene group having 1 to 20 carbon atoms, an alkenylene group having 2 to 20 carbon atoms, an alkynylene group having 2 to 20 carbon atoms, an arylene group having 6 to 20 carbon atoms, a divalent group having 7 to 20 carbon atoms obtained by combining an alkylene group, an alkenylene group, or an alkynylene group with an arylene group, and the like.

Examples of the alkylene group having 1 to 20 carbon atoms include a methylene group, an ethylene group, a propylene group, a trimethylene group, a tetramethylene group, a pentamethylene group, a hexamethylene group, and the like.

Examples of the alkenylene group having 2 to 20 carbon atoms include a vinylene group, a propenylene group, a butenylene group, a pentenylene group, and the like.

Examples of the alkynylene group having 2 to 20 carbon atoms include an ethynylene group, a propynylene group, and the like.

Examples of the arylene group having 6 to 20 carbon atoms include an o-phenylene group, an m-phenylene group, a p-phenylene group, a 2,6-naphthylene group, and the like.

Examples of a substituent that may substitute the alkylene group having 1 to 20 carbon atoms, the alkenylene group having 2 to 20 carbon atoms, and the alkynylene group having 2 to 20 carbon atoms include a halogen atom such as a fluorine atom and a chlorine atom; an alkoxy group such as a methoxy group and an ethoxy group; an alkoxycarbonyl group such as a methoxycarbonyl group and an ethoxycarbonyl group; and the like.

Examples of a substituent that may substitute the arylene group having 6 to 20 carbon atoms include a cyano group; a nitro group; a halogen atom such as a fluorine atom, a chlorine atom, and a bromine atom; an alkyl group such as a methyl group and an ethyl group; an alkoxy group such as a methoxy group and an ethoxy group; and the like.

These substituents may be bonded to the alkylene group, the alkenylene group, the alkynylene group, and the arylene group at an arbitrary position. A plurality of identical or different substituents may be bonded to the alkylene group, the alkenylene group, the alkynylene group, and the arylene group.

Examples of the divalent group obtained by combining a substituted or unsubstituted alkylene group, a substituted or unsubstituted alkenylene group, or a substituted or unsubstituted alkynylene group with a substituted or unsubstituted arylene group, include a group in which at least one group among a substituted or unsubstituted alkylene group, a substituted or unsubstituted alkenylene group, and a substituted or unsubstituted alkynylene group is linearly bonded to at least one substituted or unsubstituted arylene group, and the like. Specific examples of the divalent group include the groups respectively represented by the following formulas, and the like.

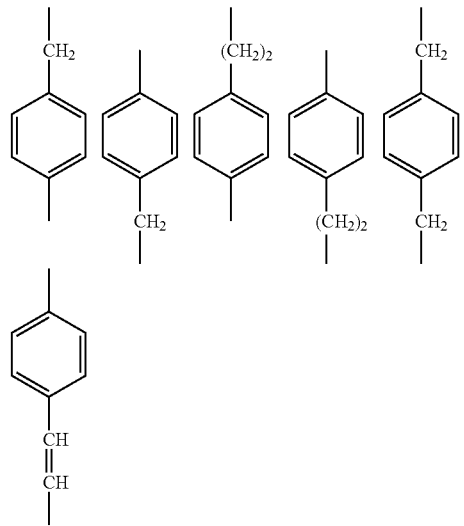

A¹ and A² are preferably an alkylene group having 1 to 4 carbon atoms (e.g., methylene group, ethylene group, propylene group, trimethylene group, or tetramethylene group).

$R^1$ is not particularly limited as long as —CO—$R^1$ can function as a protecting group. Examples of $R^1$ include an alkyl group such as a methyl group, an ethyl group, an n-propyl group, an isopropyl group, an n-butyl group, an isobutyl group, an s-butyl group, a t-butyl group, an n-pentyl group, an n-hexyl group, an n-heptyl group, an n-octyl group, an n-nonyl group, an n-decyl group, an n-undecyl group, and an n-dodecyl group; a substituted or unsubstituted phenyl group; and the like.

Examples of the substituent when $R^1$ is a substituted phenyl group include an alkyl group such as a methyl group, an ethyl group, an n-propyl group, an isopropyl group, an n-butyl group, an s-butyl group, an isobutyl group, a t-butyl group, an n-pentyl group, and an n-hexyl group; a halogen atom such as a fluorine atom, a chlorine atom, and a bromine atom; an alkoxy group such as a methoxy group and an ethoxy group; and the like.

$R^1$ is preferably an alkyl group having 1 to 20 carbon atoms, and more preferably an alkyl group having 1 to 10 carbon atoms.

v is an integer from 1 to 4, preferably 1, 2, or 4, and more preferably 2 or 4.

Examples of the silane coupling agent represented by the formula (c-1) include mercaptoalkyltrialkoxysilanes such as mercaptomethyltrimethoxysilane, mercaptomethyltriethoxysilane, mercaptomethyltripropoxysilane, 2-mercaptoethyltrimethoxysilane, 2-mercaptoethyltriethoxysilane, 2-mercaptoethyltripropoxysilane, 3-mercaptopropyltrimethoxysilane, 3-mercaptopropyltriethoxysilane, and 3-mercaptopropyltripropoxysilane.

Examples of the silane coupling agent represented by the formula (c-2) include alkanoylthioalkyltrialkoxysilane compounds such as 2-hexanoylthioethyltrimethoxysilane, 2-hexanoylthioethyltriethoxysilane, 2-octanoylthioethyltrimethoxysilane, 2-octanoylthioethyltriethoxysilane, 2-decanoylthioethyltrimethoxysilane, 2-decanoylthioethyltriethoxysilane, 3-hexanoylthiopropyltrimethoxysilane, 3-hexanoylthiopropyltriethoxysi lane, 3-octanoylthiopropyltrimethoxysilane, 3-octanoylthiopropyltriethoxysilane, 3-decanoylthiopropyltrimethoxysilane, and 3-decanoylthiopropyltriethoxysilane.

Examples of the silane coupling agent represented by the formula (c-3) include 2-trimethoxysilylethylsulfanyltrimethoxysilane, 2-trimethoxysilylethylsulfanyltriethoxysilane, 2-triethoxysilylethylsulfanyltrimethoxysilane, 2-triethoxysilylethylsulfanyltriethoxysilane, 3-trimethoxysilylpropylsulfanyltrimethoxysilane, 3-trimethoxysilylpropylsulfanyltriethoxysilane, 3-triethoxysilylpropylsulfanyltrimethoxysilane, 3-triethoxysilylpropylsulfanyltriethoxysilane, and the like.

Examples of the silane coupling agent represented by the formula (c-4) include a disulfide compound such as bis(2-trimethoxysilylethyl) disulfide, bis(2-triethoxysilylethyl) disulfide, bis(3-trimethoxysilylpropyl) disulfide, bis(3-triethoxysilylpropyl) disulfide, bis(4-trimethoxysilylbutyl) disulfide, and bis(4-triethoxysilylbutyl) disulfide; a tetrasulfide compound such as bis(2-triethoxysilylethyl) tetrasulfide, bis(3-trimethoxysilylpropyl) tetrasulfide, and bis(3-triethoxysilylpropyl) tetrasulfide; and the like.

Examples of other silane coupling agents that include a sulfur atom-containing functional group include a thiocarbamoyl group-containing silane coupling agent such as 3-trimethoxysilylpropyl-N,N-dimethylthiocarbamoyl tetrasulfide, 3-triethoxysilylpropyl-N,N-dimethylthiocarbamoyl tetrasulfide, 2-triethoxysilylethyl-N,N-dimethylthiocarbamoyl tetrasulfide, and 2-trimethoxysilylethyl-N,N-dimethylthiocarbamoyl tetrasulfide; a benzothiazolyl group-containing silane coupling agent such as 3-trimethoxysilylpropylbenzothiazolyl tetrasulfide and 3-triethoxysilylpropylbenzothiazolyl tetrasulfide; a (meth)acrylate group-containing silane coupling agent (note: the term "(meth)acrylate" refers to an acrylate or a methacrylate) such as 3-triethoxysilylpropyl (meth)acrylate monosulfide and 3-trimethoxysilylpropyl (meth)acrylate monosulfide; a polysulfide group-containing silane coupling agent such as a bis(3-triethoxysilylpropyl) polysulfid, a bis(2-triethoxysilylpropyl) polysulfide, and a bis(4-triethoxysilylbutyl) polysulfide; and the like.

Among these, the silane coupling agent represented by the formula (c-1), the silane coupling agent represented by the formula (c-3), and oligomers thereof are preferable, the silane coupling agent represented by the formula (c-1) in which $Y^1$ is an alkoxy group having 1 to 10 carbon atoms (e.g., 2-mercaptoethyltrimethoxysilane, 2-mercaptoethyltriethoxysilane, 2-mercaptoethyltripropoxysilane, 3-mercaptopropyltrimethoxysilane, 3-mercaptopropyltriethoxysilane, and 3-mercaptopropyltripropoxysilane), the silane coupling agent represented by the formula (c-3) in which $Y^1$ and $Y^2$ are an alkoxy group having 1 to 10 carbon atoms (e.g., 2-trimethoxysilylethylsulfanyltrimethoxysilane, 2-trimethoxysilylethylsulfanyltriethoxysilane, 2-triethoxysilylethylsulfanyltrimethoxysilane, 2-triethoxysilylethylsulfanyltriethoxysilane, 3-trimethoxysilylpropylsulfanyltrimethoxysilane, 3-trimethoxysilylpropylsulfanyltriethoxysilane, 3-triethoxysilylpropylsulfanyltrimethoxysilane, and 3-triethoxysilylpropylsulfanyltriethoxysilane), and oligomers thereof are more preferable, and 3-mercaptopropyltrimethoxysilane, 3-trimethoxysilylpropylsulfanyltriethoxysilane, and oligomers thereof are still more preferable as the component (C).

These silane coupling agents (C) may be used either alone or in combination.

When the curable composition according to one embodiment of the invention includes the component (C), the curable composition may include the component (C) in an arbitrary ratio. It is preferable that the curable composition include the component (A) and the component (C) in a mass ratio (component (A):component (C)) of 100:0.1 to 100:50, more preferably 100:0.3 to 100:30, and still more preferably 100:0.4 to 100:25.

When the curable composition includes the component (A) and the component (C) in a ratio within the above range, the curable composition produces a cured product that exhibits better heat resistance and adhesion.

Component (D)

The curable composition according to one embodiment of the invention may include fine particles as a component (D). A curable composition that produces a cured product that exhibits excellent delamination resistance is easily obtained by utilizing the fine particles.

The fine particles are not particularly limited. Examples of the fine particles include inorganic fine particles such as metal fine particles; metal oxide fine particles; mineral fine particles; fine particles of a metal carbonate such as calcium carbonate and magnesium carbonate; fine particles of a metal sulfate such as calcium sulfate and barium sulfate; fine particles of a metal hydroxide such as aluminum hydroxide; fine particles of a metal silicate such as aluminum silicate, calcium silicate, and magnesium silicate; silica fine particles; silicone fine particles; fine particles of a metal oxide that is covered with a silicone; organic fine particles such as acrylic beads; and the like.

These fine particles may be used either alone or in combination.

The term "metal" used herein refers to the elements that respectively belong to Group 1 (excluding H), Groups 2 to 11, Group 12 (excluding Hg), Group 13 (excluding B), Group 14 (excluding C and Si), Group 15 (excluding N, P, As, and Sb), and Group 16 (excluding O, S, Se, Te, and Po) in the periodic table.

The silica may be dry silica, wet silica, organically modified silica, or a mixture including two or more types of silica among dry silica, wet silica, organically modified silica.

The term "silicone" used herein refers to an artificial polymer compound that has a main skeleton that includes a siloxane bond. Examples of the silicone include dimethylpolysiloxane, diphenylpolysiloxane, methylphenylpolysiloxane, and the like.

Examples of the metal oxide include titanium oxide, alumina, boehmite, chromium oxide, nickel oxide, copper oxide, titanium oxide, zirconium oxide, indium oxide, zinc oxide, a complex oxide thereof, and the like. The metal oxide fine particles may be sol particles of these metal oxides.

Examples of the mineral include a smectite, a bentonite, and the like.

Examples of the smectite include montmorillonite, beidellite, hectorite, saponite, stevensite, nontronite, sauconite, and the like.

Among these, silica, a silicone, and fine particles of a metal oxide that is covered with a silicone are preferable, and silica and a silicone are more preferable.

The fine particles may have a spherical shape, a chain-like shape, a needle-like shape, a plate-like shape, a flaky shape, a rod-like shape, a fibrous shape, or the like. It is preferable that the fine particles have a spherical shape. The term "spherical shape" used herein refers to a spherical shape, and an approximately spherical shape including a polyhedral shape that can be approximated to a sphere, such as a spheroidal shape, an oval shape, a konpeito-like shape, and a cocoon-like shape.

The average primary particle size of the fine particles is preferably 0.01 to 8 m, and more preferably 0.05 to 5 μm.

The term "average primary particle size" used herein refers to a value that is determined by measuring the particle size distribution in accordance with a laser scattering method using a laser diffraction/scattering particle size distribution analyzer (e.g., "LA-920" manufactured by Horiba Ltd.).

The content of the component (D) is not particularly limited. The curable composition preferably includes the component (A) and the component (D) in a mass ratio (component (A):component (D)) of 100:0.1 to 100:30, more preferably 100:0.3 to 100:20, still more preferably 100:0.5 to 100:15, and particularly preferably 100:0.8 to 100:12.

Additional Component (E)

The curable composition according to one embodiment of the invention may include an additional component other than the above components as long as the object of the invention is not impaired.

Examples of the additional component include a diluent, an antioxidant, a UV absorber, a light stabilizer, and the like.

The diluent may be added to the curable composition according to one embodiment of the invention so that the curable composition exhibits fluidity.

Examples of the diluent include diethylene glycol monobutyl ether acetate, glycerol diglycidyl ether, butanediol diglycidyl ether, diglycidylaniline, neopentyl glycol glycidyl ether, cyclohexanedimethanol diglycidyl ether, an alkylene diglycidyl ether, polyglycol diglycidyl ether, polypropylene glycol diglycidyl ether, trimethylolpropane triglycidyl ether, glycerol triglycidyl ether, 4-vinylcyclohexene monoxide, vinylcyclohexene dioxide, methylated vinylcyclohexene dioxide, and the like.

These diluents may be used either alone or in combination.

The diluent is preferably used so that the curable composition according to one embodiment of the invention has a solid content of 50 to 100 mass %, more preferably 60 to 90 mass %, and still more preferably 70 to 85 mass %.

The antioxidant is added to the curable composition in order to prevent deterioration due to oxidation during heating. Examples of the antioxidant include a phosphorus-based antioxidant, a phenol-based antioxidant, a sulfur-based antioxidant, and the like.

Examples of the phosphorus-based antioxidant include phosphites, oxaphosphaphenanthrene oxides, and the like. Examples of the phenol-based antioxidant include monophenols, bisphenols, polyphenols, and the like. Examples of the sulfur-based antioxidant include dilauryl 3,3'-thiodipropionate, dimyristyl 3,3'-thiodipropionate, distearyl 3,3'-thiodipropionate, and the like.

These antioxidants may be used either alone or in combination. The antioxidant is normally used in a ratio of 10 mass % or less based on the component (A).

The UV absorber is added to the curable composition in order to improve the light resistance of the resulting cured product.

Examples of the UV absorber include salicylic acids, benzophenones, benzotriazoles, hindered amines, and the like.

These UV absorbers may be used either alone or in combination.

The UV absorber is normally used in a ratio of 10 mass % or less based on the component (A).

The light stabilizer is added to the curable composition in order to improve the light resistance of the resulting cured product.

Examples of the light stabilizer include hindered amines such as poly[{6-(1,1,3,3-tetramethylbutyl)amino-1,3,5-triazine-2,4-diyl}{(2,2,6,6-tetramethyl-4-piperidine) imino}hexamethylene {(2,2,6,6-tetramethyl-4-piperidine) imino}], and the like.

These light stabilizers may be used either alone or in combination.

These additional components (excluding the diluent) are normally used in a total ratio of 20 mass % or less based on the component (A).

The curable composition according to one embodiment of the invention may be prepared by producing a curable polysilsesquioxane compound (silane compound polymer (A)) as described above, and mixing the curable polysilsesquioxane compound with the component (B).

More specifically, the curable composition according to one embodiment of the invention may be prepared by mixing the component (A), the component (B), and an optional additional component in a specific ratio (so that the component (A) and the component (B) preferably account for 50 mass % or more of the mixture), and defoaming the mixture.

The mixing method and the defoaming method are not particularly limited. A known mixing method and a known defoaming method may be used.

The curable composition according to one embodiment of the invention produces a cured product that has a solid-state Si nuclear magnetic resonance spectrum in which a peak is observed within a range from −80 ppm or more to less than −40 ppm, and the half-width of the peak is 500 to 900 Hz.

The term "half-width" used herein refers to a width obtained by cutting the peak shape at a value that is half of the value (height) of the peak observed in the solid-state Si nuclear magnetic resonance spectrum. For example, when the values of peaks obtained by cutting the peak shape at a value that is half of the value of the original peak are referred to as a (ppm) and b (ppm) (b>a), the half-width is calculated by (b−a)×M (Hz) (where, M is the resonance frequency).

The half-width of the peak that is observed within a range from −80 ppm or more to less than −40 ppm is 500 to 900 Hz, preferably 500 to 800 Hz, more preferably 500 to 700 Hz, and still more preferably 500 to 600 Hz.

If the half-width of the peak that is observed within a range from −80 ppm or more to less than −40 ppm is too small, the cured product of the curable composition may not exhibit high adhesion. A peak of which the half-width exceeds 900 Hz normally rarely occurs within a range from −80 ppm or more to less than −40 ppm.

When a plurality of peaks that overlap each other are observed within a range from −80 ppm or more to less than −40 ppm, the half-width of each peak can be determined by performing curve fitting analysis that utilizes a Gaussian function or a Lorentzian function.

When the cured product that has a solid-state Si nuclear magnetic resonance spectrum in which a plurality of peaks are observed within a range from −80 ppm or more to less than −40 ppm, it suffices that the half-width of at least one peak included within a range from −80 ppm or more to less than −40 ppm be within the above range.

The solid-state Si nuclear magnetic resonance spectrum may be measured at room temperature (e.g., 25° C.) using an ordinary method.

When a plurality of peaks are observed within a range from −80 ppm or more to less than −40 ppm, it suffices that the half-width of at least one peak be 500 to 900 Hz.

It is considered that a peak that is observed within a range from −80 ppm or more to less than −40 ppm is attributed to the silicon atom that is included in the repeating unit represented by the formula (a-1).

The half-width of a peak that is observed within a range from −80 ppm or more to less than −40 ppm is affected by the type of $R^1$ included in the repeating unit represented by the formula (a-1), the amount of component (B), the presence or absence of the components (C) and (D), and the like (see the examples).

Therefore, a curable composition that meets the above requirement can be efficiently obtained by producing the silane compound polymer (A) that is used as the component (A), measuring the solid-state Si nuclear magnetic resonance spectrum of the cured product of the silane compound polymer (A), calculating the half-width of the peak observed within a range from −80 ppm or more to less than −40 ppm, and appropriately determining the amount of component (B) and the like.

Note that the chemical shift and the half-width of the peak normally do not depend on the curing conditions and the like as long as a cured product obtained by sufficiently curing the curable composition is used as the measurement sample when measuring the solid-state Si nuclear magnetic resonance spectrum.

For example, a cured product that is suitable as the measurement sample can be obtained by curing the curable composition according to one embodiment of the invention at 170° C. for 2 hours.

It is determined that the curing reaction has sufficiently proceeded, and a cured product that is suitable as the measurement sample has been obtained when a significant weight loss due to an increase in temperature is not observed by differential heat thermogravimetry (TG-DTA), for example.

The curable composition according to one embodiment of the invention obtained as described above can produce a cured product that exhibits excellent heat resistance and high adhesion.

Therefore, the curable composition according to one embodiment of the invention is suitably used as a raw material for producing an optical part or a formed article, an adhesive, a coating material, and the like. Since the curable composition according to one embodiment of the invention can reduce or suppress deterioration in an optical element-securing material due to an increase in brightness of the optical element, the curable composition may suitably be used as an optical element-securing composition.

2) Cured Product

A cured product according to one embodiment of the invention is obtained by curing the curable composition according to one embodiment of the invention.

The curable composition according to one embodiment of the invention may be cured by heating, for example. The heating temperature when curing the curable composition is normally 100 to 200° C., and the heating time is normally 10 minutes to hours, and preferably 30 minutes to 10 hours.

The cured product according to one embodiment of the invention exhibits excellent heat resistance and high adhesion.

Therefore, the cured product according to one embodiment of the invention may suitably be used as an optical element-securing material that can solve a problem with regard to deterioration due to an increase in brightness of the optical element.

A cured product obtained by curing the curable composition according to one embodiment of the invention exhibits excellent heat resistance and high adhesion when the adhesion is measured as described below, for example. Specifically, the curable composition according to one embodiment of the invention is applied to a mirror surface of a silicon chip. The surface of the silicon chip to which the curable composition has been applied is placed on and compression-bonded to an adherend, and the curable composition is cured by heating. After allowing the resulting product to stand for 30 seconds on a measurement stage of a bond tester that has been heated to a specific temperature (e.g., 23 or 100° C.), the adhesion between the specimen and the adherend is measured while applying a stress to the bonding surface in the horizontal direction (shear direction) at a height of 50 m above the adherend.

It is preferable that the cured product have an adhesion at 23° C. of 60 N/2 mm$^2$ or more, more preferably 80 N/2 mm$^2$ or more, and particularly preferably 100 N/2 mm$^2$ or more. It is preferable that the cured product have an adhesion at 100° C. of 40 N/2 mm$^2$ or more, more preferably 50 N/2 mm$^2$ or more, and particularly preferably 60 N/2 mm$^2$ or more.

3) Method for Using Curable Composition

A method for using a curable composition according to one embodiment of the invention uses the curable composition according to one embodiment of the invention as an optical element-securing adhesive or an optical element sealing material.

Examples of the optical element include a light-emitting element (e.g., LED and LD), a light-receiving element, a hybrid optical element, an optical integrated circuit, and the like.

Optical Element-Securing Adhesive

The curable composition according to one embodiment of the invention may suitably be used as an optical element-securing adhesive.

When the curable composition according to one embodiment of the invention is used as an optical element-securing adhesive, the curable composition is applied to the bonding surface of either or both of the bonding target materials (e.g., an optical element and a substrate). After compression-bonding the bonding target materials, the curable composition is cured by heating to firmly bond the bonding target materials, for example.

Examples of a substrate material (to which an optical element is bonded) include glass such as soda lime glass and heat-resistant hard glasses; a ceramic; sapphire; metals such as iron, copper, aluminum, gold, silver, platinum, chromium, titanium, alloys thereof, and stainless steel (e.g., SUS302, SUS304, SUS304L, and SUS309); a synthetic resin such as polyethylene terephthalate, polybuthylene terephthalate, polyethylene naphthalate, an ethylene-vinyl acetate copolymer, polystyrene, a polycarbonate, polymethylpentene, a polysulfone, polyether ether ketone, polyethersulfone, polyphenylene sulfide, polyetherimide, a polyimide, a polyamide, an acrylic resin, a norbornene-based resin, a cycloolefin resin, and a glass epoxy resin; and the like.

The heating temperature when curing the curable composition is selected taking account of the type of curable composition and the like, but is normally 100 to 200° C. The heating time is normally 10 minutes to 20 hours, and preferably 30 minutes to 10 hours.

Optical Element Sealing Material

The curable composition according to one embodiment of the invention may suitably be used as an optical element sealing material.

When the curable composition according to one embodiment of the invention is used as an optical element sealing material, the curable composition is formed to have the desired shape so as to include an optical element to obtain a formed article that includes the optical element, and the formed article is cured by heating to produce a sealed optical element, for example.

The curable composition according to one embodiment of the invention may be formed to have the desired shape using an arbitrary method. A known molding method such as a transfer molding method and a casting method may be used.

The heating temperature when curing the formed article (curable composition) is selected taking account of the type of curable composition and the like, but is normally 100 to 200° C. The heating time is normally 10 minutes to 20 hours, and preferably 30 minutes to 10 hours.

Since the sealed optical element is produced using the curable composition according to one embodiment of the invention, the sealed optical element exhibits excellent delamination resistance, excellent heat resistance, and high adhesion.

4) Optical Device

An optical device according to one embodiment of the invention is produced using the curable composition according to one embodiment of the invention as an optical element-securing adhesive or an optical element sealing material.

Examples of the optical element include a light-emitting element (e.g., LED and LD), a light-receiving element, a hybrid optical element, an optical integrated circuit, and the like.

The optical device according to one embodiment of the invention is produced by securing an optical element using the curable composition according to one embodiment of the invention as an optical element-securing adhesive or an optical element sealing material. Therefore, the optical device according to one embodiment of the invention has a structure in which the optical element is secured with high adhesion, and exhibits excellent durability.

EXAMPLES

The invention is further described below by way of examples and comparative examples. Note that the invention is not limited to the following examples. The units "%" and "parts" used in connection with the examples and the comparative examples respectively refer to "mass %" and "parts by mass" unless otherwise indicated.

Measurement of Mass Average Molecular Weight

The standard polystyrene-equivalent mass average molecular weight (Mw) and the standard polystyrene-equivalent number average molecular weight (Mn) of the silane compound polymer obtained in each production example were determined using the device listed below under the conditions listed below.

Device: HLC-8220 GPC manufactured by Tosoh Corporation

Column: TSKgel GMHXL, TSKgel GMHXL, and TSKgel 12000 HXL (that were
sequentially connected)

Eluent: tetrahydrofuran

Injection amount: 80 μl

Temperature: 40° C.

Flow rate: 1 ml/min

Detector: differential refractometer

Measurement of IR Spectrum

The IR spectrum of the silane compound polymer obtained in each production example was measured using a Fourier transform infrared spectrometer ("Spectrum 100" manufactured by PerkinElmer).

Solid-State Si-NMR Measurement

The cured products obtained by curing (heating) the curable compositions obtained in Examples 1 to 6 and Comparative Examples 1 to 3 at 170° C. for 2 hours were subjected to solid-state Si-NMR measurement under the conditions listed below. FIGS. 1 to 9 illustrate the resulting solid-state Si-NMR spectra.

Device: AV-500 manufactured by Bruker BioSpin K.K.

$^{29}$Si-NMR resonance frequency: 99.352 MHz

Probe: 7.0 mm (diameter) CP-MAS probe

External standard: hexamethylcyclotrisiloxane (−9.66 ppm)

Measurement temperature: 25° C.

Sample rotational speed: 4 kHz

Measurement method: pulse program hpdec (high-power decoupling)

$^{29}$Si 900 pulse width: 5.5 μs

Repetition time: 600 s

Integration count: 128

Observation width: 30 kHz
Broadening factor: 20 Hz
Data Processing Method

When performing the solid-state Si-NMR measurement, the measurement data was captured (time domain size: 1,024), and subjected to zero filling (8,192 points) and a Fourier transform.

Curve Fitting Analysis

The chemical shift of each peak of the spectrum subjected to a Fourier transform was subjected to optimization calculations in accordance with a nonlinear least squares method using the chemical shift, the height, and the half-width of the peak shape, and the component ratio of the Gaussian waveform and the Lorentzian waveform as variable parameters.

Measurement of Adhesive Strength

The curable composition was applied to a mirror surface of a silicon chip (2×2 mm) to a thickness of about 2 m. The surface of the silicon chip to which the curable composition was applied was placed on and compression-bonded to an adherend (silver-plated copper sheet). The curable composition was cured by heating at 170° C. for 2 hours to prepare a specimen-bonded adherend. After allowing the specimen-bonded adherend to stand for 30 seconds on a measurement stage of a bond tester ("Series 4000" manufactured by Dage Co., Ltd.) that had been heated to a specific temperature (23° C. or 100° C.), the adhesive strength (N/2 mm$^2$) (23° C. and 100° C.) between the specimen and the adherend was measured while applying a stress (speed: 200 μm/s) to the bonding surface in the horizontal direction (shear direction) at a height of 50 μm above the adherend.

Production Example 1

A 300 ml recovery flask was charged with 71.37 g (400 mmol) of methyltriethoxysilane ("KBE-13" manufactured by Shin-Etsu Chemical Co., Ltd.). After the addition of an aqueous solution prepared by dissolving 0.10 g (0.25 mol % based on the total amount of silane compound) of 35% hydrochloric acid in 21.6 ml of distilled water with stirring, the mixture was stirred at 30° C. for 2 hours, and then stirred at 70° C. for 5 hours. After the addition of 140 g of propyl acetate, the mixture was stirred. After the addition of 0.12 g (0.5 mol % based on the total amount of silane compound) of 28% aqueous ammonia to the mixture with stirring, the resulting mixture was heated to 70° C., and stirred for 3 hours. Purified water was added to the reaction mixture to effect separation. This operation was repeated until the aqueous layer had a pH of 7. The organic layer was concentrated using an evaporator, and the concentrate was dried under vacuum to obtain 55.7 g of a silane compound polymer (A1). The silane compound polymer (A1) had a mass average molecular weight (Mw) of 7,800 and a molecular weight distribution (Mw/Mn) of 4.52.

The IR spectral data of the silane compound polymer (A1) is shown below. Si—CH$_3$: 1272 cm$^{-1}$, 1409 cm$^{-1}$, Si—O: 1132 cm$^{-1}$ Production Example 2

A 300 ml recovery flask was charged with 20.2 g (102 mmol) of phenyltrimethoxysilane (manufactured by Tokyo Chemical Industry Co., Ltd.), 3.15 g (18 mmol) of 2-cyanoethyltrimethoxysilane (manufactured by AZmax Co.), 96 ml of acetone (solvent), and 24 ml of distilled water (solvent). After the addition of 0.15 g (1.5 mmol) of phosphoric acid (manufactured by Kanto Chemical Co., Inc.) (catalyst) with stirring, the mixture was stirred at 25° C. for a further 16 hours.

After completion of the reaction, the reaction mixture was concentrated to 50 ml using an evaporator. After the addition of 100 ml of ethyl acetate to the concentrate, the mixture was neutralized using a saturated sodium hydrogen carbonate aqueous solution. After allowing the mixture to stand a while, the organic layer was isolated preparatively. The organic layer was washed twice with distilled water, and dried over anhydrous magnesium sulfate. After separating magnesium sulfate by filtration, the filtrate was concentrated to 50 ml using an evaporator, and the concentrate was added dropwise to a large quantity of n-hexane to effect precipitation. The resulting precipitate was separated by decantation. The precipitate thus separated was dissolved in methyl ethyl ketone (MEK), and the solution was collected. The solvent was evaporated under reduced pressure using an evaporator. The residue was dried under vacuum to obtain 13.5 g of a silane compound polymer (A2). The silane compound polymer (A2) had a mass average molecular weight (Mw) of 1,870 and a molecular weight distribution (Mw/Mn) of 1.42.

The IR spectral data of the silane compound polymer (A2) is shown below. Si-Ph: 698 cm$^{-1}$, 740 cm$^{-1}$, Si—O: 1132 cm$^{-1}$, —CN: 2259 cm$^{-1}$ Production Example 3

Methyltrimethoxysilane and dimethyldimethoxysilane were subjected to a polycondensation reaction in accordance with the method described in Example 1 of JP-A-2007-112975 to obtain a solution including a silane compound polymer (A3).

Example 1

1,3,5-N-Tris[3-(trimethoxysilyl)propyl] isocyanurate (silane coupling agent (B1)) (component (B)) (10 parts) and 3-(trimethoxysilyl)propylsuccinic anhydride (silane coupling agent (B2)) (component (B)) (3 parts) were added to the silane compound polymer (A1) obtained in Production Example 1 (100 parts). The mixture was sufficiently mixed and defoamed to obtain a curable composition 1.

The curable composition 1 was subjected to solid-state Si-NMR measurement and adhesive strength measurement in the same manner as described above. The results are listed in Table 1. FIG. 1 illustrates the solid-state Si-NMR spectrum of the resulting cured product.

Example 2

A curable composition 2 was obtained in the same manner as in Example 1, except that 3-mercaptopropyltrimethoxysilane ("KBM-803" manufactured by Shin-Etsu Chemical Co., Ltd.) (5 parts) was further added as the component (C).

Figure 2:
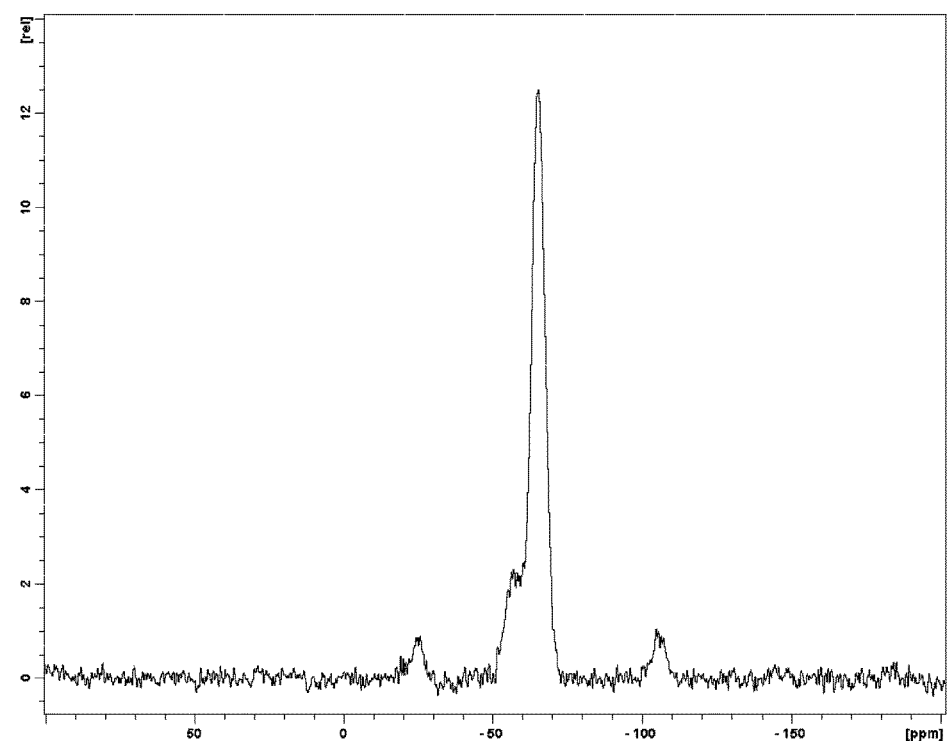
FIG. 2 illustrates the solid-state Si-NMR spectrum of the cured product obtained in Example 2.

The curable composition 2 was subjected to solid-state Si-NMR measurement and adhesive strength measurement in the same manner as described above. The results are listed in Table 1. FIG. 2 illustrates the solid-state Si-NMR spectrum of the resulting cured product.

Example 3

A curable composition 3 was obtained in the same manner as in Example 2, except that a silica fine powder ("AERO- SIL RX300" manufactured by Nippon Aerosil Co., Ltd.) (20 parts) was further added as the component (D).

Figure 3:
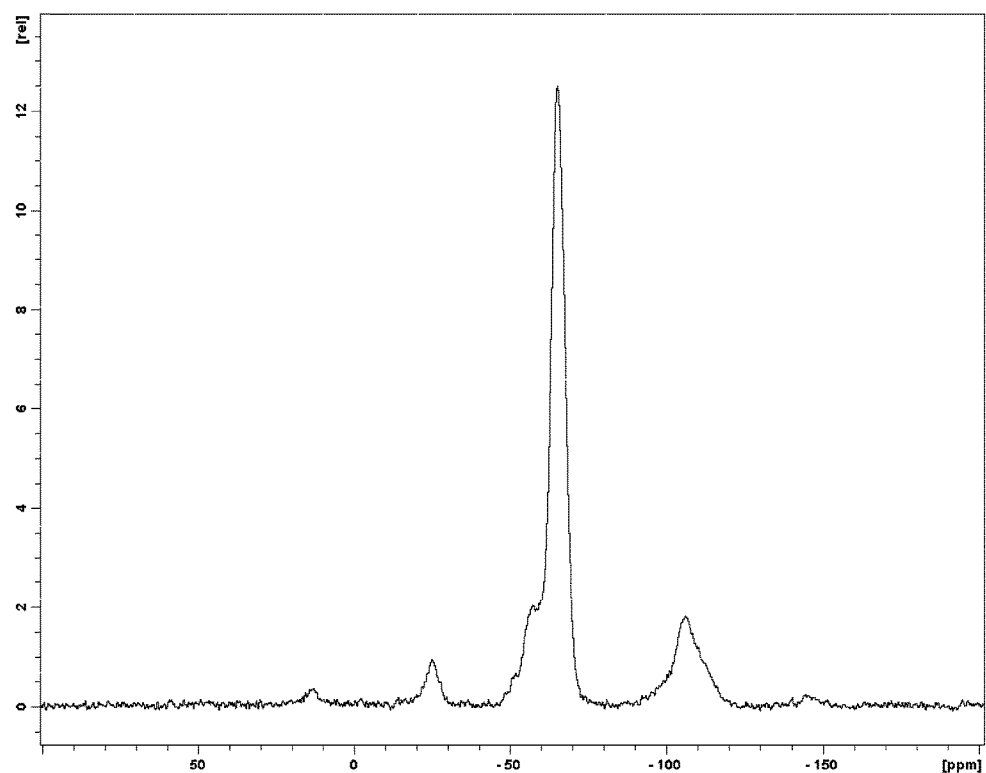
FIG. 3 illustrates the solid-state Si-NMR spectrum of the cured product obtained in Example 3.

The curable composition 3 was subjected to solid-state Si-NMR measurement and adhesive strength measurement in the same manner as described above. The results are listed in Table 1. FIG. 3 illustrates the solid-state Si-NMR spectrum of the resulting cured product.

Example 4

1,3,5-N-Tris[3-(trimethoxysilyl)propyl] isocyanurate (silane coupling agent (B1)) (component (B)) (10 parts) and 3-(trimethoxysilyl)propylsuccinic anhydride (silane coupling agent (B2)) (component (B)) (1 part) were added to the silane compound polymer (A2) obtained in Production Example 2 (100 parts). The mixture was sufficiently mixed and defoamed to obtain a curable composition 4.

Figure 4:
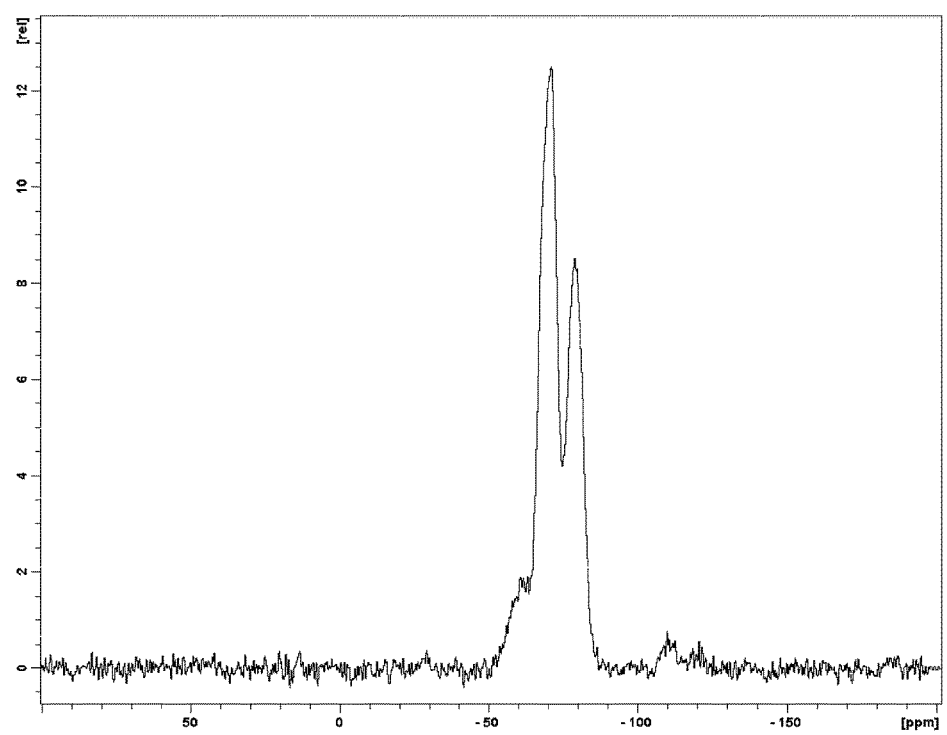
FIG. 4 illustrates the solid-state Si-NMR spectrum of the cured product obtained in Example 4.

The curable composition 4 was subjected to solid-state Si-NMR measurement and adhesive strength measurement in the same manner as described above. The results are listed in Table 1. FIG. 4 illustrates the solid-state Si-NMR spectrum of the resulting cured product.

Comparative Example 1

Figure 5:
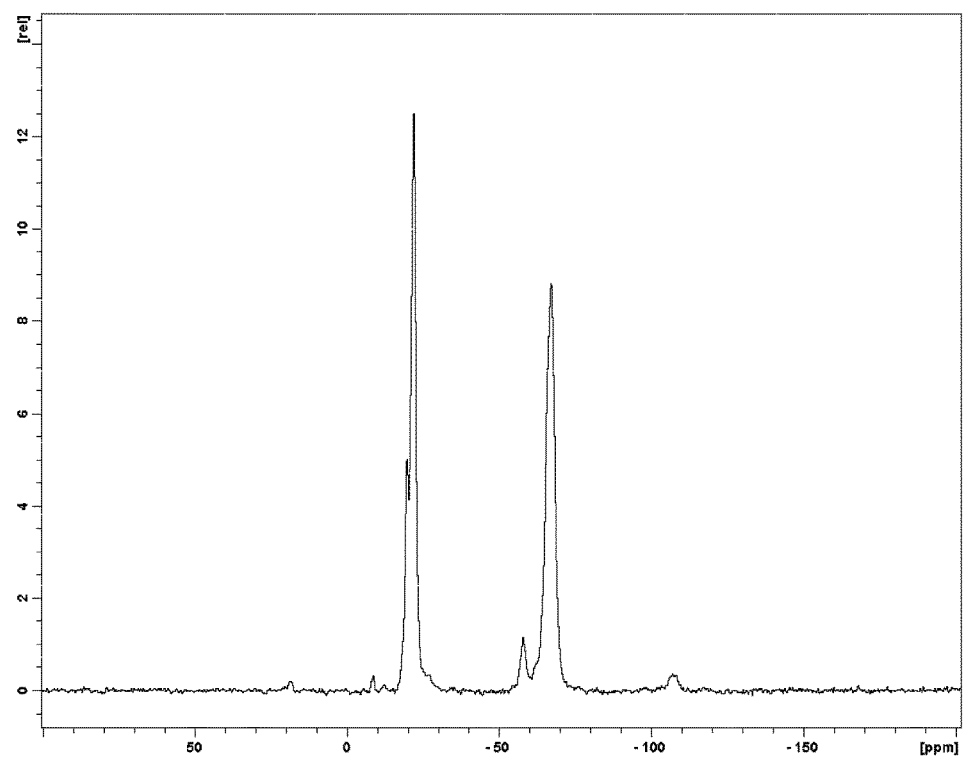
FIG. 5 illustrates the solid-state Si-NMR spectrum of the cured product obtained in Comparative Example 1.

A cured product was obtained using the solution obtained in Production Example 3 instead of the curable compositions 1 to 4 obtained in Examples 1 to 4, and solid-state Si-NMR measurement and adhesive strength measurement were performed in the same manner as described above. The results are listed in Table 1. FIG. 5 illustrates the solid-state Si-NMR spectrum of the resulting cured product.

After completion of the reaction, 100 ml of ethyl acetate was added to the reaction mixture, and the resulting mixture was neutralized using a saturated sodium hydrogen carbonate aqueous solution. After allowing the mixture to stand for a while, the organic layer was isolated preparatively. The organic layer was washed twice with distilled water, and dried over anhydrous magnesium sulfate. After separating magnesium sulfate by filtration, the filtrate was concentrated to 50 ml using an evaporator, and the concentrate was added dropwise to a large quantity of n-hexane to effect precipitation. The resulting precipitate was separated by decantation. The precipitate was dissolved in methyl ethyl ketone, and the solution was collected. After evaporating the solvent under reduced pressure using an evaporator, the residue was dried under vacuum to obtain 15.3 g of a silane compound copolymer (A4).

The silane compound copolymer (A4) had a weight average molecular weight (Mw) of 2,600 and a molecular weight distribution (Mw/Mn) of 1.60.

The IR spectral data of the silane compound copolymer (A4) is shown below. Si-Ph: 700 $cm^{-1}$, 742 $cm^{-1}$, Si—O: 1132 $cm^{-1}$, —CO: 1738 $cm^{-1}$ Production Example 5

A 300 ml recovery flask was charged with 11.9 g (60 mmol) of phenyltrimethoxysilane (manufactured by Tokyo Chemical Industry Co., Ltd.), 14.2 g (60 mmol) of 3-glycidoxypropyltrimetoxysilane (manufactured by Tokyo Chemical Industry Co., Ltd.), 60 ml of toluene (solvent), and 30 ml of distilled water (solvent). After the addition of 0.15 g (1.5

TABLE 1

| | | Example | | | | Comparative Example |
|---|---|---|---|---|---|---|
| | | 1 | 2 | 3 | 4 | 1 |
| Silane compound polymer | Upper: Type | (A1) | (A1) | (A1) | (A2) | (A3) |
| | Lower: Ratio (parts) | 100 | 100 | 100 | 100 | 100 |
| Silane coupling agent (B1) | Ratio (parts) | 10.00 | 10.00 | 10.00 | 10.00 | — |
| Silane coupling agent (B2) | Ratio (parts) | 3.00 | 3.00 | 3.00 | 1.00 | — |
| Component (C) | Ratio (parts) | — | 5.00 | 5.00 | — | — |
| Component (D) | Ratio (parts) | — | — | 20.00 | — | — |
| Solid-state Si-NMR measurement Upper: Chemical shift (ppm) Lower: Half-width (Hz) | Peak within a range of less than −80 ppm | | | | −107.1 −1453.6 | |
| | Peak within a range from −80 ppm or more to less than −40 ppm | −65.2 519.3 −57.2 691.1 | −65.2 516.9 −56.9 662.8 | −65.3 503.3 −57.2 762.6 | −78.9 572.6 −70.0 620.1 −60.4 807.9 | −66.8 326.9 −57.8 214.8 |
| | Peak within a range of −40 ppm or more | | | | | −21.7 164.4 −19.5 −133.4 |
| Adhesive strength (N/2 $mm^2$) | 23° C. | 249.33 | 172.67 | 170.35 | 65.99 | Fell |
| | 100° C. | 146.05 | 136.75 | 95.13 | 47.89 | Fell |

Production Example 4

A 300 ml recovery flask was charged with 11.9 g (60 mmol) of phenyltrimethoxysilane (manufactured by Tokyo Chemical Industry Co., Ltd.), 13.3 g (60 mmol) of 3-acetoxypropyltrimethoxysilane (manufactured by AZmax Co.), 60 ml of toluene (solvent), and 30 ml of distilled water (solvent). After the addition of 0.15 g (1.5 mmol) of phosphoric acid (manufactured by Kanto Chemical Co., Inc.) (catalyst) with stirring, the mixture was stirred at room temperature for a further 16 hours.

mmol) of phosphoric acid (manufactured by Kanto Chemical Co., Inc.) (catalyst) with stirring, the mixture was stirred at room temperature for a further 16 hours.

After completion of the reaction, 100 ml of ethyl acetate was added to the reaction mixture, and the resulting mixture was neutralized using a saturated sodium hydrogen carbonate aqueous solution. After allowing the mixture to stand for a while, the organic layer was isolated preparatively. The organic layer was washed twice with distilled water, and dried over anhydrous magnesium sulfate. After separating magnesium sulfate by filtration, the filtrate was concentrated to 50 ml using an evaporator, and the concentrate was added dropwise to a large quantity of n-hexane to effect precipitation. The resulting precipitate was separated by decantation. The precipitate was dissolved in methyl ethyl ketone (MEK), and the solution was collected. After evaporating the solvent under reduced pressure using an evaporator, the residue was dried under vacuum to obtain 16.3 g of a silane compound copolymer (A5).

The silane compound copolymer (A5) had a weight average molecular weight (Mw) of 2,800.

The IR spectral data of the silane compound copolymer (A5) is shown below. Si-Ph: 699 cm$^{-1}$, 741 cm$^{-1}$, Si—O: 1132 cm$^{-1}$, epoxy group: 1254 cm$^{-1}$ Example 5

1,3,5-N-Tris[3-(trimethoxysilyl)propyl] isocyanurate (silane coupling agent (B 1)) (component (B)) (10 parts) and 3-(trimethoxysilyl)propylsuccinic anhydride (silane coupling agent (B2)) (component (B)) (1 part) were added to the silane compound copolymer (A4) obtained in Production Example 4 (100 parts). The mixture was sufficiently mixed and defoamed to obtain a curable composition 5.

Figure 6:
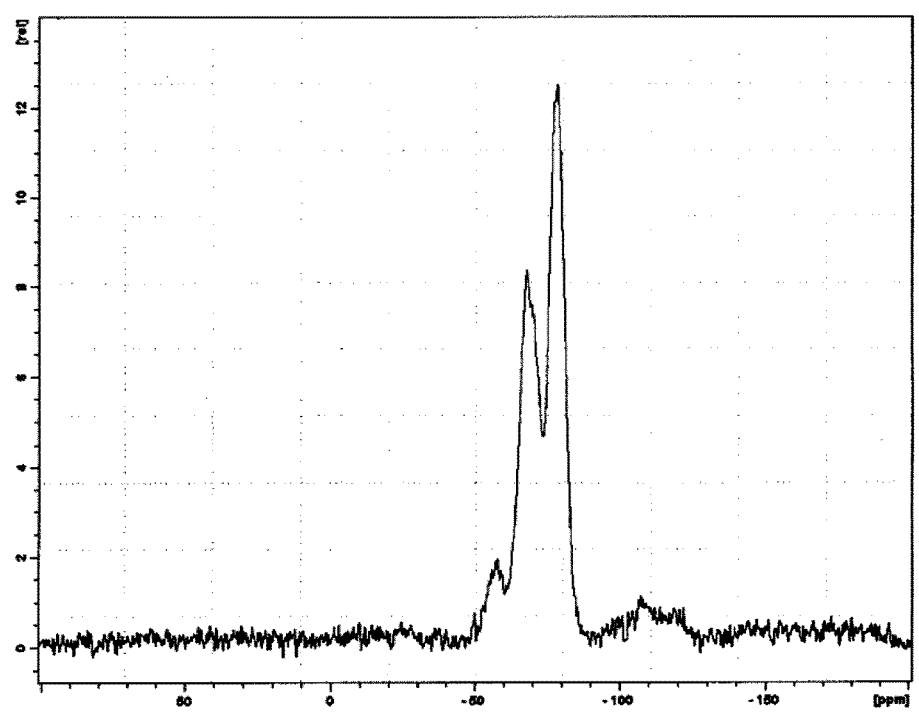
FIG. 6 illustrates the solid-state Si-NMR spectrum of the cured product obtained in Example 5.

The curable composition 5 was subjected to solid-state Si-NMR measurement and adhesive strength measurement in the same manner as described above. The results are listed in Table 2. FIG. 6 illustrates the solid-state Si-NMR spectrum of the resulting cured product.

Example 6

1,3,5-N-Tris[3-(trimethoxysilyl)propyl] isocyanurate (silane coupling agent (B1)) (component (B)) (10 parts) and 3-(trimethoxysilyl)propylsuccinic anhydride (silane coupling agent (B2)) (component (B)) (1 part) were added to the silane compound copolymer (A5) obtained in Production Example 5 (100 parts). The mixture was sufficiently mixed and defoamed to obtain a curable composition 6.

Figure 7:
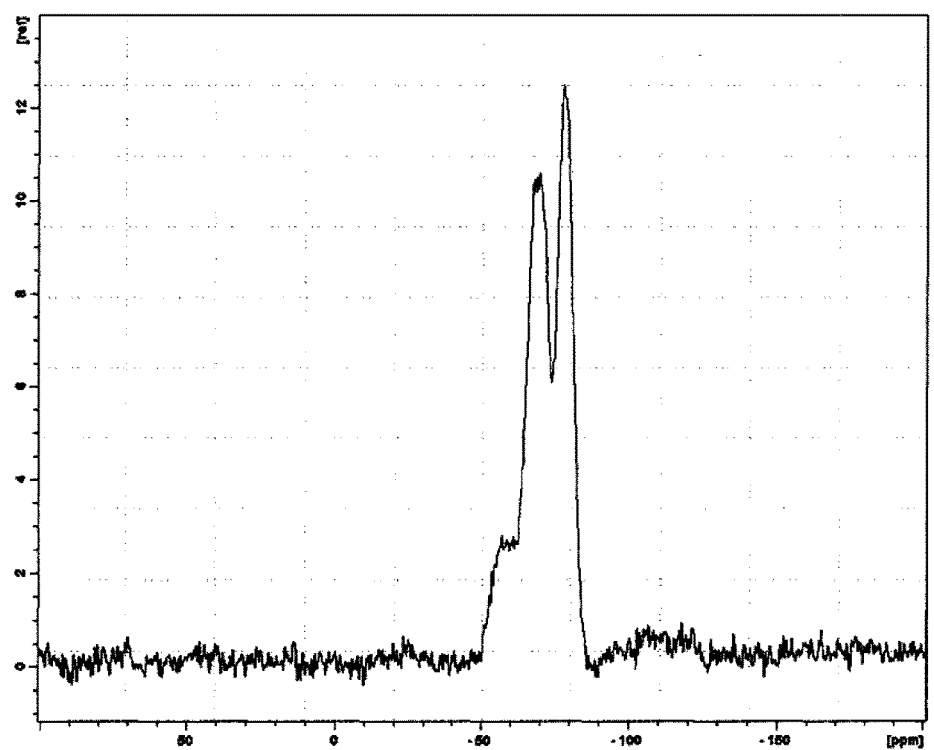
FIG. 7 illustrates the solid-state Si-NMR spectrum of the cured product obtained in Example 6.

The curable composition 6 was subjected to solid-state Si-NMR measurement and adhesive strength measurement in the same manner as described above. The results are listed in Table 2. FIG. 7 illustrates the solid-state Si-NMR spectrum of the resulting cured product.

Comparative Example 2

1,3,5-N-Tris[3-(trimethoxysilyl)propyl] isocyanurate (silane coupling agent (B1)) (component (B)) (10 parts) and 3-(trimethoxysilyl)propylsuccinic anhydride (silane coupling agent (B2)) (component (B)) (3 parts) were added to a commercially-available silsesquioxane compound having a cage-like structure (silane compound polymer (A6), "POSS-Octaphenyl substituted" manufactured by ALDRICH) (100 parts). The mixture was sufficiently mixed and defoamed to obtain a curable composition 7.

Figure 8:
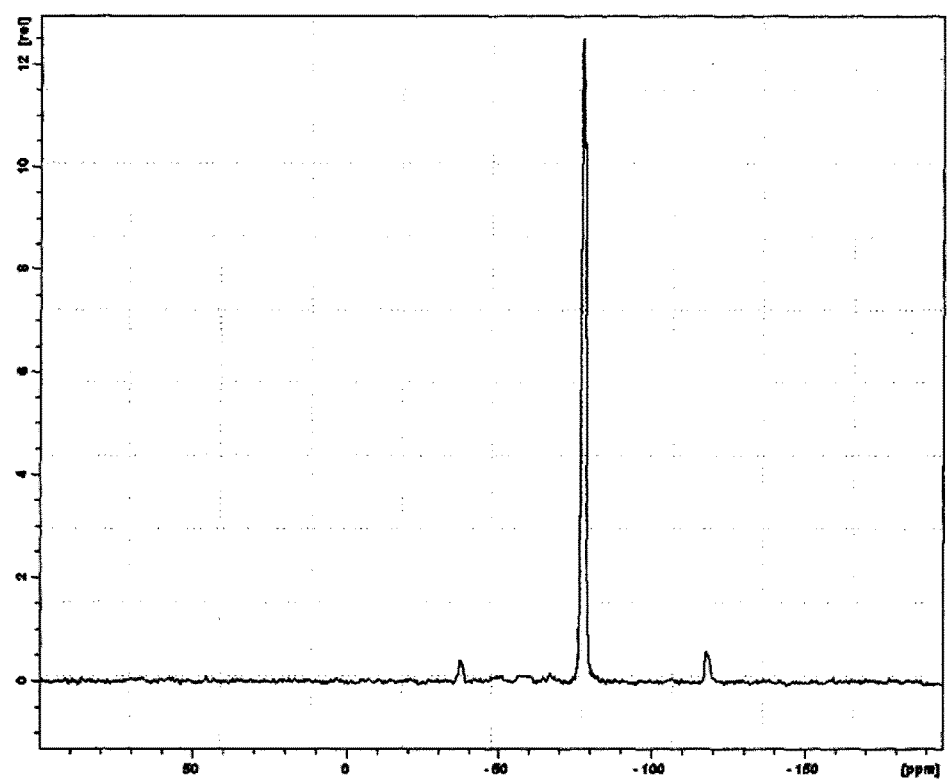
FIG. 8 illustrates the solid-state Si-NMR spectrum of the cured product obtained in Comparative Example 2.

The curable composition 7 was subjected to solid-state Si-NMR measurement and adhesive strength measurement in the same manner as described above. The results are listed in Table 2. FIG. 8 illustrates the solid-state Si-NMR spectrum of the resulting cured product.

Comparative Example 3

1,3,5-N-Tris[3-(trimethoxysilyl)propyl] isocyanurate (silane coupling agent (B 1)) (component (B)) (10 parts) and 3-(trimethoxysilyl)propylsuccinic anhydride (silane coupling agent (B2)) (component (B)) (3 parts) were added to a commercially-available silsesquioxane compound having a cage-like structure (silane compound polymer (A7), "Octaglycidyl (OG)" manufactured by Mayaterials) (100 parts). The mixture was sufficiently mixed and defoamed to obtain a curable composition 8.

Figure 9:
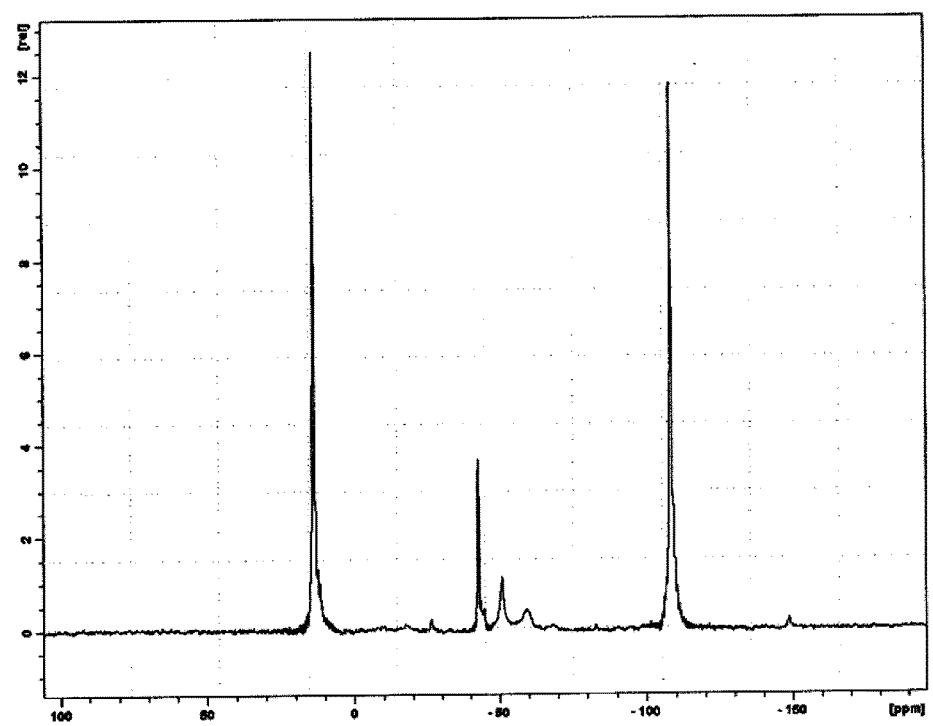
FIG. 9 illustrates the solid-state Si-NMR spectrum of the cured product obtained in Comparative Example 3.

The curable composition 8 was subjected to solid-state Si-NMR measurement and adhesive strength measurement in the same manner as described above. The results are listed in Table 2. FIG. 9 illustrates the solid-state Si-NMR spectrum of the resulting cured product.

TABLE 2

| | | Example 5 | Example 6 | Comparative Example 2 | Comparative Example 3 |
|---|---|---|---|---|---|
| Silane compound polymer | | A4 | A5 | A6 | A7 |
| Silane coupling agent (B1) | Ratio (parts) | 10 | 10 | 10 | 50 |
| Silane coupling agent (B2) | Ratio (parts) | 1 | 1 | 3 | 5 |
| Component (C) | Ratio (parts) | — | — | — | — |
| Component (D) | Ratio (parts) | — | — | — | — |
| Solid-state Si-NMR measurement Upper: Chemical shift (ppm) Lower: Half-width (Hz) | Peak within a range of less than −80 ppm | | | | −108.5 74.8 |
| | Peak within a range from −80 ppm or more to less than −40 ppm | −78.4 609.0 −68.6 719.9 −56.8 678.9 | −78.4 599.9 −69.0 789.4 | −78.3 80.5 −77.4 102.2 | −59.2 312.3 50.8 179.5 −44.3 115.1 −42.7 54.9 |
| | Peak within a range of −40 ppm or more | | −57.5 905.4 | | 13.8 64.9 |
| Adhesive strength (N/2 mm$^2$) | 23° C. | 58.77 | 63.56 | Fell | Fell |
| | 100° C. | 45.61 | 51.07 | Fell | Fell |

The following were confirmed from the results listed in Tables 1 and 2.

When the cured products of the curable compositions 1 to 6 of Examples 1 to 6 were subjected to the solid-state Si-NMR measurement, a peak of which the half-width was 500 to 900 Hz was observed within a range from −80 ppm or more to less than −40 ppm. The cured products of the curable compositions 1 to 6 of Examples 1 to 6 exhibited excellent adhesive strength at 23° C. and 100° C. (i.e., exhibited excellent adhesion and excellent heat resistance).

When the cured products obtained in Comparative Examples 1 to 3 were subjected to the solid-state Si-NMR measurement, a peak of which the half-width was 500 to 900 Hz was not observed within a range from −80 ppm or more to less than −40 ppm. The cured products obtained in Comparative Examples 1 to 3 exhibited poor adhesion.

The invention claimed is:

1. A curable composition comprising a component (A) and a component (B),
the curable composition producing a cured product that has a solid-state Si nuclear magnetic resonance spectrum in which a peak is observed within a range from −80 ppm or more to less than −40 ppm, and a half-width of the peak is 500 to 900 Hz,
the component (A) being a curable polysilsesquioxane compound that comprises a repeating unit represented by a formula (a-1), $$R^1SiO_{3/2} \qquad (a\text{-}1)$$

wherein $R^1$ is a substituted or unsubstituted alkyl group having 1 to 10 carbon atoms, or a substituted or unsubstituted aryl group, and
the component (B) being at least one silane coupling agent selected from a group consisting of a silane coupling agent that comprises a nitrogen atom in its molecule, and a silane coupling agent that comprises an acid anhydride structure in its molecule.

2. The curable composition according to claim 1, wherein $R^1$ is a substituted or unsubstituted alkyl group having 1 to 10 carbon atoms.

3. The curable composition according to claim 1, wherein the curable polysilsesquioxane compound that is used as the component (A) has a mass average molecular weight (Mw) of 1,000 to 30,000.

4. The curable composition according to claim 1, wherein the curable polysilsesquioxane compound that is used as the component (A) is a curable polysilsesquioxane compound obtained by subjecting at least one compound represented by a formula (a-2) to polycondensation in the presence of a polycondensation catalyst, $$R^1Si(OR^2)_x(X^1)_{3-x} \qquad (a\text{-}2)$$

wherein $R^1$ is a substituted or unsubstituted alkyl group having 1 to 10 carbon atoms, or a substituted or unsubstituted aryl group, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present.

5. The curable composition according to claim 1, wherein the component (B) comprises both the silane coupling agent that comprises a nitrogen atom in its molecule, and the silane coupling agent that comprises an acid anhydride structure in its molecule.

6. The curable composition according to claim 1, the curable composition comprising the component (A) and the component (B) in a mass ratio (component (A):component (B)) of 100:0.01 to 100:50.

7. A method for producing the curable composition according to claim 1, comprising:
a step (I) that subjects at least one compound represented by a formula (a-2) to polycondensation in the presence of a polycondensation catalyst to obtain the curable polysilsesquioxane compound, $$R^1Si(OR^2)_x(X^1)_{3-x} \qquad (a\text{-}2)$$

wherein $R^1$ is the same as defined above, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present; and
a step (II) that mixes the curable polysilsesquioxane compound obtained by the step (I) with at least one silane coupling agent selected from the group consisting of the silane coupling agent that comprises a nitrogen atom in its molecule, and the silane coupling agent that comprises an acid anhydride structure in its molecule.

8. The method according to claim 7, wherein at least an acid catalyst is used as the polycondensation catalyst.

9. The method according to claim 8, wherein the acid catalyst is at least one compound selected from phosphoric acid, hydrochloric acid, boric acid, citric acid, acetic acid, sulfuric acid, and methanesulfonic acid.

10. A cured product obtained by curing the curable composition according to claim 1.

11. The cured product according to claim 10, the cured product being an optical element-securing material.

12. An optical element securing adhesive, comprising the curable composition according to claim 1 as an optical element-securing adhesive.

13. An optical element sealing material, comprising the curable composition according to claim 1 as an optical element sealing material.

14. An optical device produced using the curable composition according to claim 1 as an optical element-securing adhesive or an optical element sealing material.

* * * * *